US010686210B2

(12) United States Patent
Tsunokuni et al.

(10) Patent No.: US 10,686,210 B2
(45) Date of Patent: Jun. 16, 2020

(54) SECONDARY BATTERY MOUNTED CHIP MANUFACTURING METHOD

(71) Applicant: KABUSHIKI KAISHA NIHON MICRONICS, Musashino-shi, Tokyo (JP)

(72) Inventors: Kazuyuki Tsunokuni, Tokyo (JP); Tatsuo Inoue, Tokyo (JP); Tomokazu Saitoh, Tokyo (JP); Juri Ogasawara, Tokyo (JP); Takashi Tonokawa, Tokyo (JP); Takuo Kudoh, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 122 days.

(21) Appl. No.: 15/749,306

(22) PCT Filed: Jun. 20, 2016

(86) PCT No.: PCT/JP2016/068219
§ 371 (c)(1),
(2) Date: Jan. 31, 2018

(87) PCT Pub. No.: WO2017/022347
PCT Pub. Date: Feb. 9, 2017

(65) Prior Publication Data
US 2018/0226674 A1  Aug. 9, 2018

(30) Foreign Application Priority Data

Jul. 31, 2015 (JP) .................................. 2015-152490

(51) Int. Cl.
*H01L 27/04* (2006.01)
*H01M 10/04* (2006.01)
(Continued)

(52) U.S. Cl.
CPC ........ *H01M 10/0431* (2013.01); *H01L 21/77* (2013.01); *H01L 21/822* (2013.01);
(Continued)

(58) Field of Classification Search
CPC combination set(s) only.
See application file for complete search history.

(56) References Cited

U.S. PATENT DOCUMENTS 6,264,709 B1   7/2001  Yoon et al.
2002/0179951 A1  12/2002  Yoshiyama et al.
(Continued)

FOREIGN PATENT DOCUMENTS

JP    S59-25531 A    2/1984
JP    2000-106366 A  4/2000
(Continued)

OTHER PUBLICATIONS

Sep. 13, 2016 International Search Report issued in International Patent Application No. PCT/JP2016/068219.
(Continued)

*Primary Examiner* — Tony Tran
(74) *Attorney, Agent, or Firm* — Oliff PLC

(57) ABSTRACT

A method for manufacturing oxide semiconductor secondary cells concurrently and evenly on a plurality of chips. A method for manufacturing a chip on which an oxide semiconductor secondary cell is mounted, the oxide semiconductor secondary cell that is formed by layering a first electrode, a charging function layer, and a second electrode being layered on a circuit. The method includes a layering process to layer and form the oxide semiconductor secondary cells integrally at regions corresponding to a plurality of chips formed on a wafer without separately forming oxide semiconductor secondary cells at regions corresponding to the respective chips, and a separating process to perform
(Continued)

separation into individual oxide semiconductor secondary cells corresponding to the respective chips by performing pattern etching on the integrally-formed oxide semiconductor secondary cells to eliminate regions not corresponding to the respective chips except for regions corresponding to the respective chips.

13 Claims, 21 Drawing Sheets

(51) Int. Cl.
   *H01L 21/8234* (2006.01)
   *H01L 27/06* (2006.01)
   *H01L 21/822* (2006.01)
   *H01L 21/77* (2017.01)

(52) U.S. Cl.
   CPC .......... *H01L 21/8234* (2013.01); *H01L 27/04* (2013.01); *H01L 27/06* (2013.01)

(56) References Cited

U.S. PATENT DOCUMENTS

| | | |
|---|---|---|
| 2009/0148764 A1 | 6/2009 | Kwak et al. |
| 2012/0214047 A1 | 8/2012 | Kwak et al. |
| 2013/0224596 A1 | 8/2013 | Nakazawa |
| 2014/0352775 A1 | 12/2014 | Kudoh et al. |
| 2015/0155608 A1 | 6/2015 | Kudoh et al. |
| 2015/0325862 A1 | 11/2015 | Song et al. |
| 2016/0181588 A1* | 6/2016 | Tsunokuni ............. H02S 50/00 429/61 |

FOREIGN PATENT DOCUMENTS

| | | |
|---|---|---|
| JP | 2002-353328 A | 12/2002 |
| JP | 2004-281593 A | 10/2004 |
| JP | 2006-286690 A | 10/2006 |
| JP | 2007-026982 | 2/2007 |
| JP | 2011-501388 A | 1/2011 |
| JP | 2014-158379 A | 8/2014 |
| WO | 2012/46325 A1 | 4/2012 |
| WO | 2013/183132 A1 | 12/2013 |
| WO | 2014/099974 A1 | 6/2014 |
| WO | 2015/129051 A1 | 9/2015 |

OTHER PUBLICATIONS

Feb. 6, 2018 International Preliminary Report on Patentability issued in International Patent Application No. PCT/JP2016/068219.
Jun. 18, 2019 Extended Search Report issued in European Patent Application No. 16832626.2.

\* cited by examiner

SECONDARY BATTERY MOUNTED CHIP MANUFACTURING METHOD

TECHNICAL FIELD

The present invention relates to a method for manufacturing a secondary-cell-mounted chip in which a secondary cell is integrally formed on a chip that is prepared on a wafer such as a silicon substrate.

BACKGROUND ART

Lead storage cells, nickel-cadmium storage cells, lithium-ion secondary cells, and the like have been developed and practically used as secondary cells capable of charging and storing electricity. Recently, all-solid-state secondary cells capable of being formed with thin films have been drawing attention and have been applied to small-sized devices with features of safety and space-saving for being mounted.

Patent Document 1 discloses a semiconductor device into which a solid-state thin film secondary cell is internally arranged in a monolithic manner by forming the solid-state thin film secondary cell on a substrate, and thereby, a semiconductor device in which an electronic element and the solid-state secondary cell are arranged as circuits in a monolithic manner. The solid-state thin film secondary cell is an all-solid-state lithium-ion secondary cell. The solid-state thin film secondary cell is internally arranged in a monolithic manner by forming the solid-state thin film secondary cell, on the substrate, as having a porous film formed through surface modification of a semiconductor element substrate as a negative-electrode active material.

As illustrated in FIG. 20, in an IC/LSI chip 116 of a semiconductor element substrate on which a monolithic secondary cell is mounted, solid-state thin film secondary cells formed in a monolithic manner are connected to IC/LSI portions respectively via internal wirings 112-1, 112-2. A monolithic solid-state thin film secondary cell group 110-1 that supplies power to a memory circuit unit 114 and a monolithic secondary cell group 110-2 that supplies power mainly to a logic circuit unit 113 are integrated on the substrate of the IC/LSI chip 116 together with a circuit group. Both of the above can be electrically connected respectively by a plurality of internal wirings. Although external wirings may be adopted, advantages of a monolithic type are considered to be drastically lost in such a case.

Patent Document 2 discloses a cell-mounted type integrated circuit device in which a semiconductor chip is mounted on a solid-state cell. The solid-state cell includes a charging element that includes a positive electrode, a negative electrode, and a solid electrolyte, and a protection film arranged outside the charging element. Here, the protection film has a multi-layer structure and at least one layer thereof has a positive electrical potential. It can be packaged with the protection film while preventing ions for charging-discharging from being diffused to the integrated circuit and preventing characteristic deterioration and false operation of the semiconductor device. Accordingly, it is possible to provide a cell-mounted type integrated circuit device having reduced mounting area.

In a chip illustrated in FIG. 21, silver paste is coated on a lead frame 120 prepared for cell-mounting and a solid-state cell 122 is heated at 200° C. and arranged thereon. Liquid epoxy resin is coated thereon and a semiconductor chip 124 is arranged. Then, wiring is performed with insulation-coated gold wires 128 having a diameter of 100 μm by soldering the semiconductor chip 124 and the lead frame 120, and the solid-state cell 122 and the lead frame 120. Sealing is performed with epoxy resin 126.

Patent Document 3 discloses a structure of an element of a thin film cell integration type in which a thin film cell and an element can be electrically connected without using connecting means such as a wire while the thin film cell is formed as being directly layered on a chip or the element.

It is structured to include the element, an insulating layer being an electrically non-conductive member that covers the element, a pair of element terminals vertically arranged on the element or a side face thereof, a pair of vertical conductive members having conductivity as being vertically arranged on the element terminals respectively from an upper end thereof to a position of the upper most surface of the insulating layer, and a thin film cell that includes a negative electrode thin film and a positive electrode thin film formed on the pair of vertical conductive members. Further, it is disclosed that a pair of electrode conductive members may be arranged as well that are electrically connected to the positive electrode and the negative electrode of the thin film cell as being arranged on the pair of vertical conductive members and as being horizontally distanced on the insulating layer.

Patent Document 4 discloses a structure that an all-solid-state cell is layered on a RAM chip. A passivation film is formed on a surface of the RAM, and a positive or negative electrode material film of the cell, a solid electrolyte film, and a negative or positive electrode material film are sequentially formed thereon. Regarding connection of the cell and the RAM chip, a power terminal and a ground terminal of a circuit integrated in a semiconductor are connected to the positive electrode and the negative electrode of the cell via a power collector.

CITED DOCUMENT

Patent Document

Patent Document 1: Japanese Patent Application Laid-Open No. 2004-281593
Patent Document 2: Japanese Patent Application Laid-Open No. 2007-026982
Patent Document 3: Japanese Patent Application Laid-Open No. 2000-106366
Patent Document 4: Japanese Patent Application Laid-Open No. S59-25531

SUMMARY OF THE INVENTION

As described above, a variety of proposals have been provided for the technology to mount a solid-state thin film secondary cell on a semiconductor substrate. They are roughly categorized into a structure that a solid-state thin film secondary cell separately prepared as a circuit chip is mounted on and integrated physically with a semiconductor substrate, a structure that a forming region for a solid-state thin film secondary cell is arranged at a semiconductor substrate and a solid-state thin film secondary cell is formed thereat, and a structure that a solid-state thin film secondary cell is mounted on a circuit chip as being layered thereon.

A solid-state thin film secondary cell is thinner and smaller than a nickel-cadmium storage cell and a lead storage cell being traditional secondary cells. Accordingly, it is possible to achieve drastic space-saving for a secondary cell. Further, it is possible to arrange an extremely small cell as a micro cell. Here, with the structure of being layered and mounted on a circuit chip, mount space for a secondary cell is not required to be arranged, a small device can be achieved, and a secondary cell can be formed directly on a circuit as well.

Here, with the structure that a solid-state thin film secondary cell separately prepared as a circuit chip is mounted on and integrated physically with a semiconductor substrate, noise may be caused by floating capacitance and floating reactance parasitizing connection lines (wires) that connect the solid-state thin film secondary cell and the semiconductor substrate and slew rate of an integrated circuit may be caused to be reduced.

With the structure that a forming region for a solid-state thin film secondary cell is arranged at a semiconductor substrate and a solid-state thin film secondary cell is formed thereat, there is a drawback that area is widened by the forming region of the solid-state thin film secondary cell.

A semiconductor integrated circuit element also called an IC chip or an integrated circuit chip is generally obtained by concurrently forming a plurality of pieces thereof on a silicon wafer and cutting-off into separate chips with dicing. Regarding a method for concurrently manufacturing semiconductor substrates each having a solid-state thin film secondary cell, it is only disclosed in the related art simply that secondary cells are layered with a traditional technology on an integrated circuit. This is because that consistency of the manufacturing processes cannot be ensured with the technology for manufacturing an integrated circuit under restriction of manufacturing conditions of secondary cells to be layered, so that secondary cells are difficult to be formed on the common integrated circuit. Accordingly, a specific method enabling to perform the manufacturing has become an issue.

Although the structure that a secondary cell is mounted directly on an integrated circuit chip as being layered thereon provides effects for power noise and load fluctuation, there has been desired to effectively manufacture secondary cells that are even with less variation using structural features thereof and structural features of a secondary cell itself.

An object of the present invention is to provide a method, regarding a chip of an integrated circuit to which an oxide semiconductor secondary cell capable of being formed with thin films is integrally formed, for manufacturing oxide semiconductor secondary cells concurrently and evenly on a plurality of chips.

A chip on which a secondary cell is mounted has a feature that an integrated circuit and the secondary cell are integrally formed and the secondary cell is formed with layering on a region facing to the integrated circuit. The integrated circuit includes at least an element component structured with a logic circuit, a sensor, or a micro electro mechanical system (MEMS) and forms a functional element such as a logic circuit structured with an electronic circuit and an MEMS obtained by adding any of a mechanical elemental component, a sensor, and an actuator to a memory element, a central processing unit (CPU), or an electronic circuit.

A method of the present invention for manufacturing chips on which an oxide semiconductor secondary cell is mounted respectively is a method for manufacturing chips on which an oxide semiconductor secondary cell is mounted respectively, the oxide semiconductor secondary cell being formed by layering a first electrode, a charging function layer, and a second electrode on a circuit, including a layering process to layer and form the oxide semiconductor secondary cells integrally at regions corresponding to a plurality of chips formed on a wafer without separately forming the oxide semiconductor secondary cells at regions corresponding to the respective chips; and a separating process to perform separation into individual oxide semiconductor secondary cells corresponding to the respective chips by performing pattern etching on the integrally-formed oxide semiconductor secondary cells to eliminate regions not corresponding to the respective chips except for regions corresponding to the respective chips.

The method further includes a first electrode connection line forming process to connect the first electrode to a first electrode pad formed at each chip; and a second electrode connection line forming process to connect the second electrode to a second electrode pad formed at each chip, the second electrode pad being different from the first electrode pad, so that the oxide semiconductor secondary cell is connected to an integrated circuit.

Regarding forming of the first electrode and the first electrode connection line, the method further includes a first electrode forming process to form the first electrode on each chip via an insulating layer; and a first electrode connection line forming process to form a first electrode connection line for connecting the first electrode to a first electrode pad on each chip via a via-hole of the insulating layer, and then, the first electrode forming process and the first electrode connection line forming process are concurrently performed.

The method further includes a first flattening process to flatten an insulating layer before the first electrode is formed on each chip via the insulating layer formed on each chip, so that the first electrode is to be formed as an even layer.

The method further includes a second flattening process to thicken the insulating layer, after the first electrode forming process and the first electrode connection line forming process are concurrently performed, for covering the first electrode pad and flattening a step between the insulting layer and the first electrode. According to the second flattening process, the first electrode pad can be protected. Further, according to the second flattening process, the step between the insulating layer and the first electrode is flattened and layers formed thereafter are to be evenly formed.

The method further includes a second electrode connection line forming process to connect the second electrode to a second electrode pad formed at each chip after the separating process, the second electrode pad being different from the first electrode pad.

The method further includes an insulating layer forming process to form the insulating layer on each chip; a process to flatten the insulating layer; and an opening forming process to form an opening communicating with each chip at the insulating layer, and then, the first electrode forming process and the first electrode connection line forming process are concurrently performed by forming a first electrode pattern on the insulating layer and the opening.

The charging function layer is formed with an n-type metal oxide semiconductor forming process to form an n-type metal oxide semiconductor layer on the first electrode, a charging layer forming process to form a charging layer formed of an insulating member and an n-type metal oxide semiconductor on the n-type metal oxide semiconductor layer, and a p-type metal oxide semiconductor layer forming process to form a p-type metal oxide semiconductor layer on the charging layer.

Connecting between the second electrode and the chip is performed with a passivation film forming process to form an insulating passivation film at a region that covers the individual oxide semiconductor secondary cells including the second electrode after the second electrode is formed, an eliminating process to eliminate the passivation film at a region corresponding to the second electrode and a region corresponding to each chip to which the second electrode is to be connected, and a second electrode connection line forming process to form a second electrode connection line pattern for connecting the second electrode and each chip at regions where the passivation is eliminated with the eliminating process.

The charging layer is formed by coating and burning chemical fluid including aliphatic acid titanium and silicon oil.

The charging layer formed by burning is irradiated with ultraviolet.

The integrally-formed oxide semiconductor secondary cells are separated into pieces and a plurality of the secondary cells are formed on each chip in the separating process.

The method further includes a serial connection line forming process to serially connect the plurality of oxide semiconductor secondary cells formed on each chip.

The method further includes a serial connection line forming process to serially connect some of the plurality of oxide semiconductor secondary cells formed on each chip, without connecting to the chip, to an oxide semiconductor secondary cell that is connected to another chip.

The serial connection line forming process is performed concurrently with a second electrode connection line forming process to connect the second electrode and a second electrode pad formed on the wafer.

An oxide semiconductor secondary cell manufactured with a method of the present invention for manufacturing chips on which an oxide semiconductor secondary cell is mounted respectively is structured with a layered member obtained by sequentially layering an insulating layer that is formed on a chip; a first electrode that is connected to a first electrode pad on the chip via a first electrode connection line formed at an opening of the insulating layer; an n-type metal oxide semiconductor layer; a charging layer formed of an insulating material and an n-type metal oxide semiconductor; a p-type metal oxide semiconductor layer; a second electrode; a passivation film that covers the second electrode and a layered layer; and a second electrode connection line that connects the second electrode and a second electrode pad of the chip as being formed at an opening of the passivation film, the second electrode pad being different from the first electrode pad.

A wafer manufactured with a method of the present invention for manufacturing chips on which an oxide semiconductor cell is mounted respectively includes a plurality of chips and a plurality of oxide semiconductor secondary cells formed on the plurality of chips. Here, some of the plurality of oxide semiconductor secondary cells may be independent from the plurality of chips without being connected to any of the chips.

A method of the present invention for manufacturing a chip on which an oxide semiconductor secondary cell is mounted is a method for manufacturing a chip on which an oxide semiconductor secondary cell is mounted, the oxide semiconductor secondary cell that is formed by layering a first electrode, a charging function layer, and a second electrode being layered on a circuit, including a layering process to layer and form the oxide semiconductor secondary cell integrally at a region corresponding to the chip formed on a wafer; and a forming process to form the oxide semiconductor secondary cell corresponding to the chip by performing pattern etching on the integrally-formed oxide semiconductor secondary cell to eliminate regions not corresponding to the chip except for a region corresponding to the chip.

The present invention provides a method for manufacturing a secondary-cell-mounted circuit chip with which an oxide semiconductor secondary cell is collectively formed as being layered at a region that covers a face facing to integrated circuits of a plurality of chips formed on a wafer, and thereafter, the oxide semiconductor secondary cell is separated into regions corresponding to the respective integrated circuits.

Compared to a method of layering on chips respectively corresponding to each chip, even oxide semiconductor secondary cells having less variation can be manufactured with a method to layer an oxide semiconductor secondary cell collectively on a plurality of chips. To keep the oxide semiconductor secondary cells corresponding to the respective chips, it is simply required to eliminate an unnecessary oxide semiconductor secondary cell with pattern etching or the like out of the oxide semiconductor secondary cells formed on the chips. Thus, the manufacturing processes can be simplified.

In the present invention, even in a case that there exists a chip on which an oxide semiconductor secondary cell is not required to be formed among a plurality of chips formed on a wafer, an oxide semiconductor secondary cell is layered on regions including a region for the chip on which an oxide semiconductor secondary cell is not required to be formed. Accordingly, it is possible to manufacture even oxide semiconductor secondary cells having less variation. The oxide semiconductor secondary cell on the chip on which an oxide semiconductor secondary cell is not required to be formed is simply required to be eliminated in a separating process. Accordingly, it is possible to actualize the above without requiring a special manufacturing process.

The oxide semiconductor secondary cell layered on the chips can be separated into a plurality of the oxide semiconductor secondary cells simply by designing the shape of a resist pattern for the separating process in accordance with the shape of the chips. Accordingly, a special manufacturing process is not required. Further, connection lines for connecting the separated oxide semiconductor secondary cells in series can be actualized with the same process as the process for manufacturing the second electrode connection lines. Accordingly, a special manufacturing process is not required.

EMBODIMENTS OF THE INVENTION

An oxide semiconductor secondary cell is safe, has high energy density, and can be formed with a thin film. Since mount space can be drastically reduced, it is suitable for equipment downsizing. The present invention provides a method for manufacturing a chip on which an oxide semiconductor secondary cell actualizing further space-saving is mounted by forming the oxide semiconductor secondary cell on a face opposed to a plurality of chips formed on a wafer and forming a package as an integrated structure.

A chip includes at least an elemental component structured with a logic circuit, a sensor, or a micro electro mechanical system (MEMS) and forms a functional element such as a logic circuit structured with an electronic circuit and an MEMS obtained by adding any of a mechanical elemental component, a sensor, and an actuator to a memory element, a central processing unit (CPU), or an electronic circuit.

Figure 1:
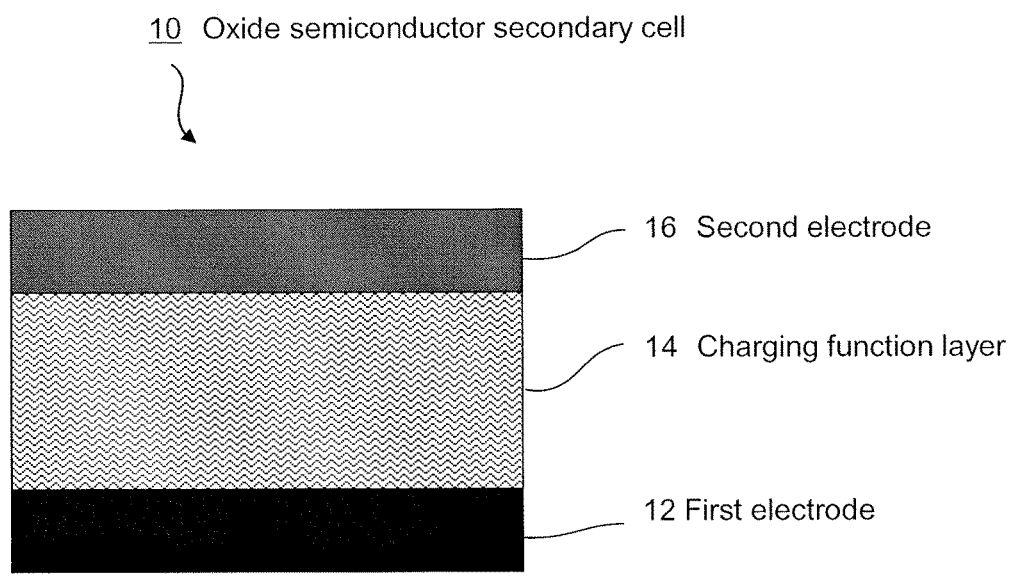
FIG. 1 is a view illustrating an oxide semiconductor secondary cell to be layered on a chip formed on a wafer.

FIG. 1 is a sectional view illustrating a structure of an oxide semiconductor secondary cell to be layered on a chip.

As a basic structure, an oxide semiconductor secondary cell 10 has a structure that a charging function layer 14 is sandwiched by a first electrode 12 and a second electrode 16. For example, a negative electrode of a power source is connected to the first electrode 12 of the oxide semiconductor secondary cell 10 and a positive electrode of the power source is connected to a second electrode 16 of the oxide semiconductor secondary cell 10. Then, owing to that a voltage is supplied therebetween, electrical charges are stored at the charging function layer 14. Here, an oxide semiconductor secondary cell represents a device having an electricity storing function as including an oxide semiconductor.

In an oxide semiconductor secondary cell using a metal oxide, the charging function layer 14 includes a plurality of layers of an n-type metal oxide semiconductor, an n-type metal oxide semiconductor and an insulating material, a p-type metal oxide semiconductor, and the like.

A secondary cell of the present invention is a secondary cell that does not require an additional substrate and can be manufactured with processes without having thermal, mechanical, and electrical influences to an integrated circuit. That is, the secondary cell of the present invention is not an all-solid-state lithium-ion secondary cell but an oxide semiconductor secondary cell. An all-solid-state lithium-ion secondary cell is structured with a plurality of layers of a solid electrolyte, an electrical collector, and the like and exerts a harmful effect on a chip during manufacturing processes therefor.

Figure 2:
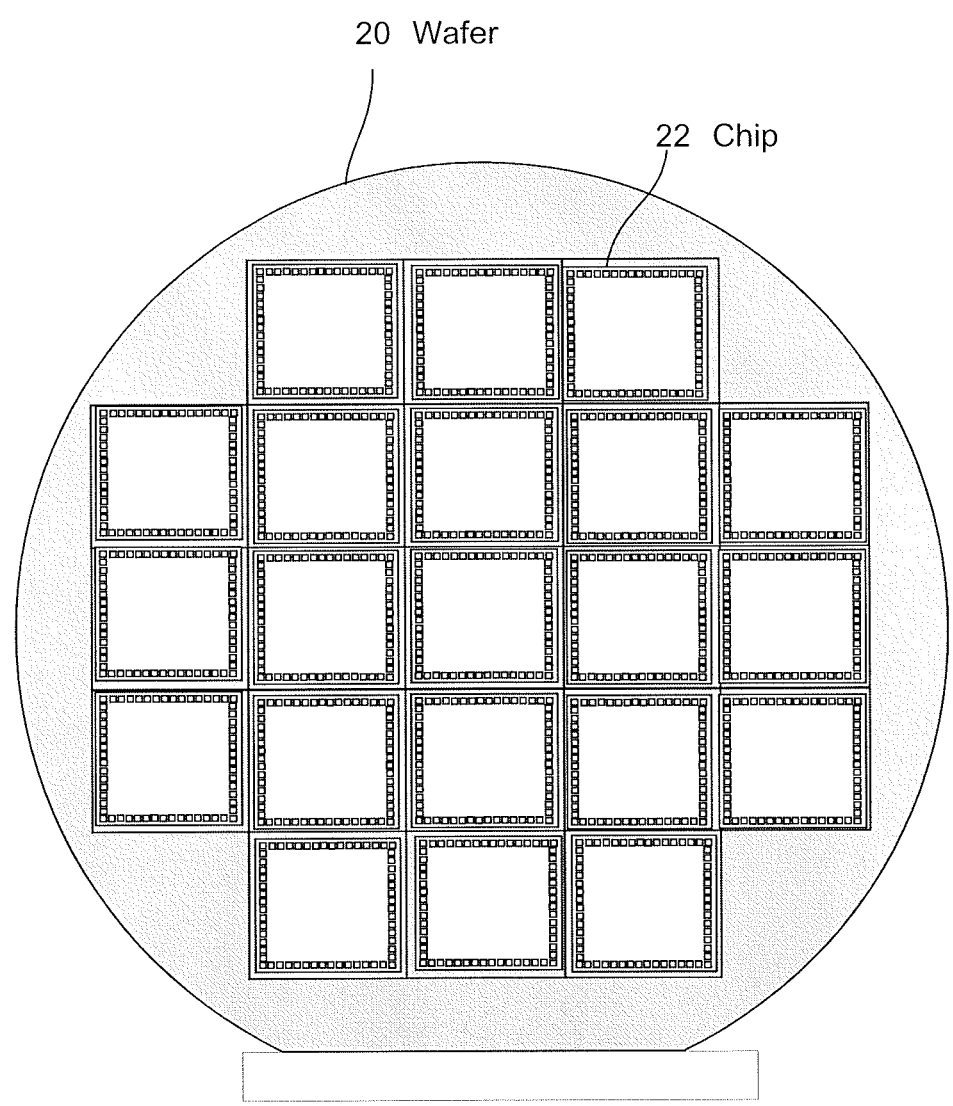
FIG. 2 is a view illustrating the wafer on which a plurality of chips are formed.
Figure 3:
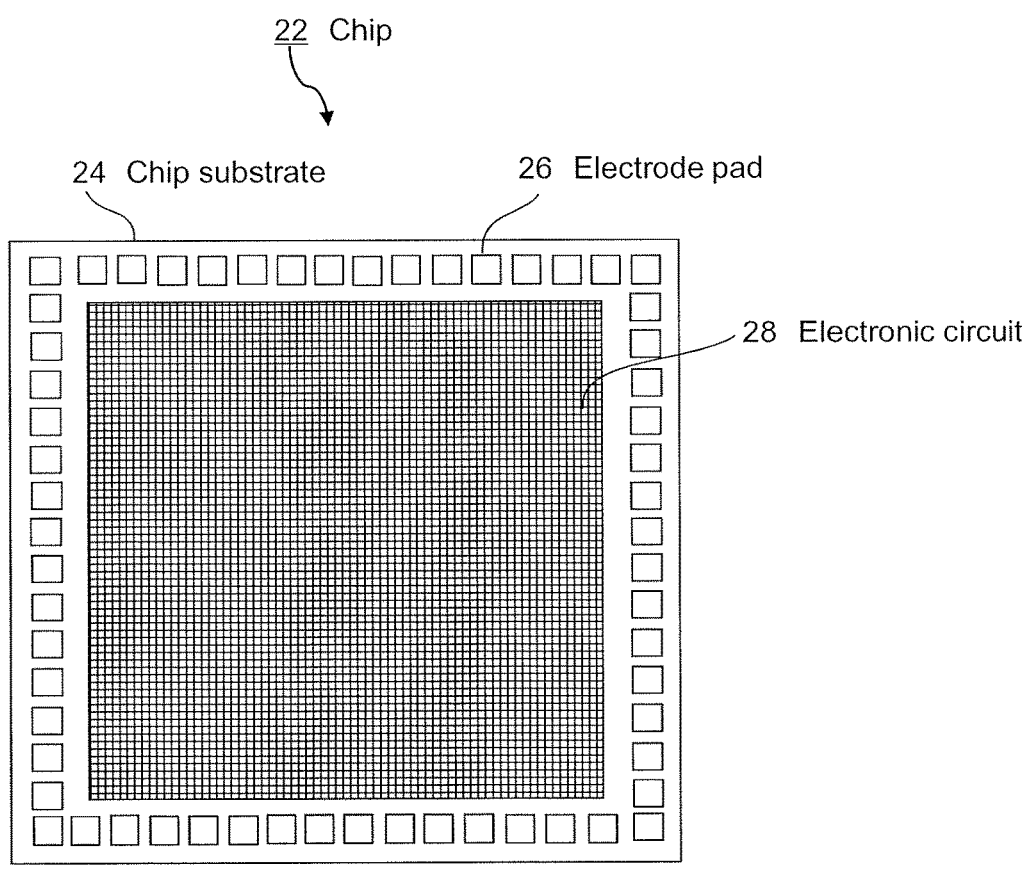
FIG. 3 is a view illustrating a structure of the chip.

FIG. 2 is a plane view of a wafer on which a plurality of chips are formed. FIG. 3 is a view illustrating a structure of a chip.

As illustrated in FIG. 2, a plurality of chips 22 are formed on a wafer 20 with semiconductor manufacturing processes. For example, each of the chips 22 includes a chip substrate 24, an electrode pad 26, and an electronic circuit 28, as illustrated in FIG. 3. A plurality of the electrode pads 26 are arranged at a periphery portion of the chip substrate 24. Further, the electronic circuit 28 is arranged on the chip substrate 24 as being surrounded by the plurality of electrode pads 26. The electrode pads 26 are connected with positive and negative electrodes of a voltage source for supplying to the electronic circuit 28 and signal lines of the electronic circuit.

The electronic circuit 28 is, for example, an integrated circuit in which a logic circuit such as a memory and a CPU, a number of MOS transistors, and the like are arranged. In the electronic circuit 28, an MEMS such as a mechanical elemental component, a sensor, and an actuator may be adopted other than a logic circuit such as a memory and a CPU. Even in a case that a region for an oxide semiconductor secondary cell is limited depending on a kind of the electronic circuit 28, patterning can be adopted in a forming process for each layer.

Figure 4:
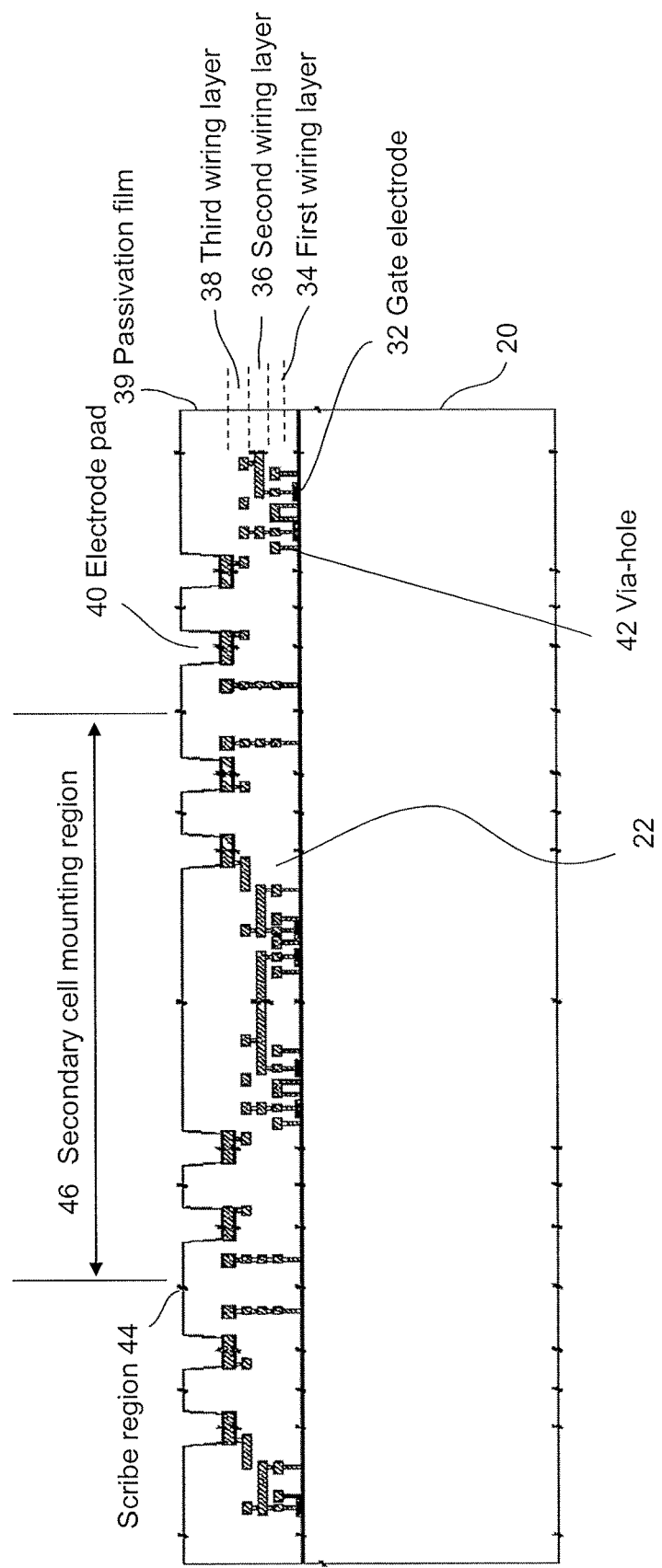
FIG. 4 is a view illustrating a section of the chip.

FIG. 4 illustrates an example of a sectional view of a passivated chip on a wafer.

An oxide semiconductor secondary cell is arranged at a secondary cell mounting region 46 on the chip 22 arranged on the wafer 20. The chip 22 on which the oxide semiconductor secondary cell is arranged is cut off at a scribe region 44 to be separated as an individual chip.

The sectional view illustrates a multilayer wiring structure in which a first wiring layer 34, a second wiring layer 36, and a third wiring layer 38 are arranged in the chip 22. Electrical connection is provided between the respective wiring layers via via-holes 42. Electrical connection between each wiring layer and an external element is provided via the electrode pad 40.

A well diffusion layer structure, an element separation structure, a source-drain diffusion structure, and the like used for a CMOS are not illustrated in the sectional view. Further, dimensions in the drawing have an aspect ratio that is different from the actual one. For example, for a pad region, a dimension in the lateral direction is a few tens of micrometers and a dimension in the longitudinal direction is in the order of one micrometer.

A passivation film 39 is formed on the wire at the upmost layer (the third wiring layer 38) as a surface protection film. Here, it is opened on the electrode pad 40 for wire bonding and the like without forming the passivation film 39 thereon. In the semiconductor manufacturing process, it proceeds to back grinding and testing steps. Here, an oxide semiconductor secondary cell is layered on a chip after the manufacturing process of pad opening is completed, so that the chip on which the oxide semiconductor secondary cell is mounted is manufactured.

Figure 5:
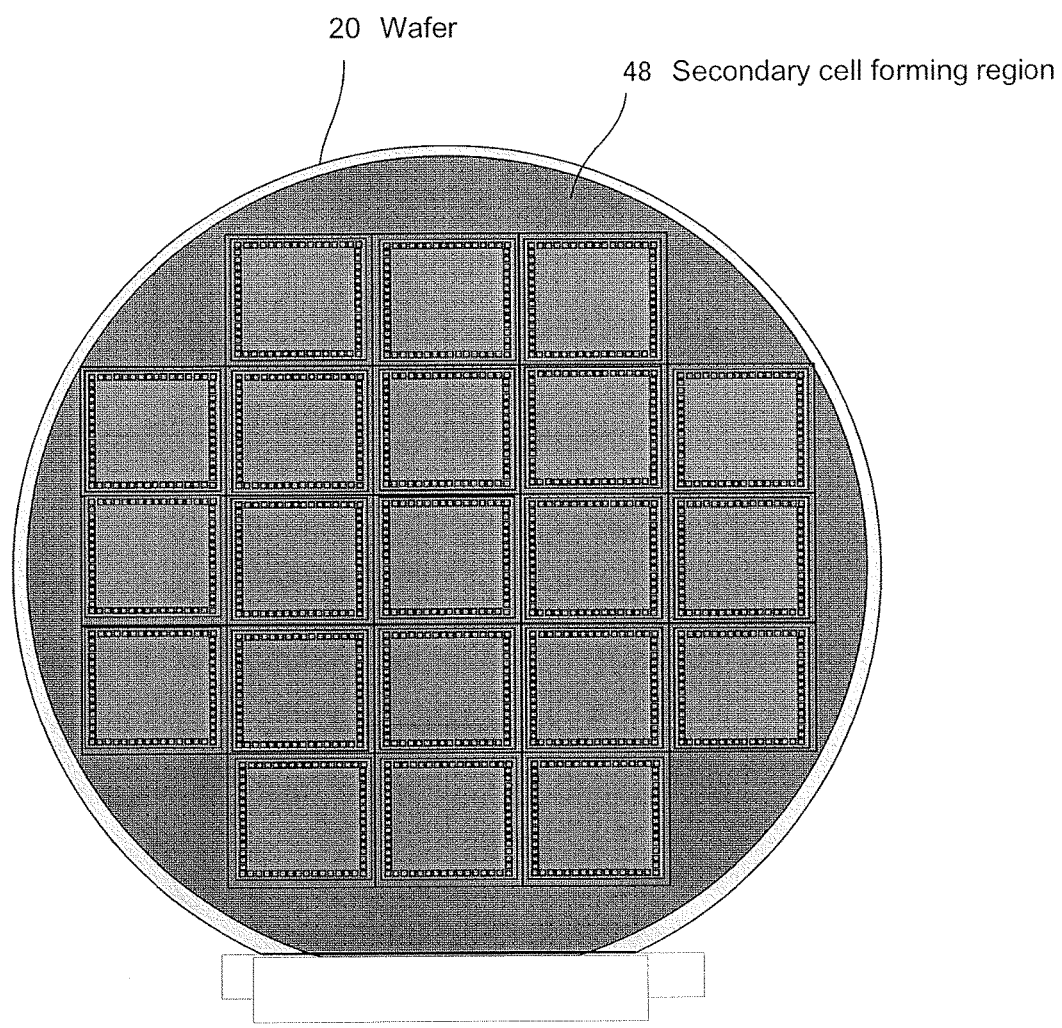
FIG. 5 is a view illustrating a secondary cell forming region on the wafer.

FIG. 5 is a view illustrating a secondary cell forming region where an oxide semiconductor secondary cell is layered on a wafer.

The plurality of chips 22 are formed on the wafer 20. The secondary cell forming region 48 includes a region that covers all the plurality of chips and a region that does not correspond to a chip (e.g., the scribe region).

The oxide semiconductor secondary cell is not required to be mounted on all the chips. There may be a case that the oxide semiconductor secondary cell is mounted on a predetermined number of integrated circuits. In this case as well, the oxide semiconductor secondary cell is formed at the secondary cell forming region 48 including regions for all the chips while including a region where an oxide semiconductor secondary cell is not to be mounted on the chip 22. This is because of that an even layer having less variation can be formed by forming a layer at once on an even plane.

Figure 6:
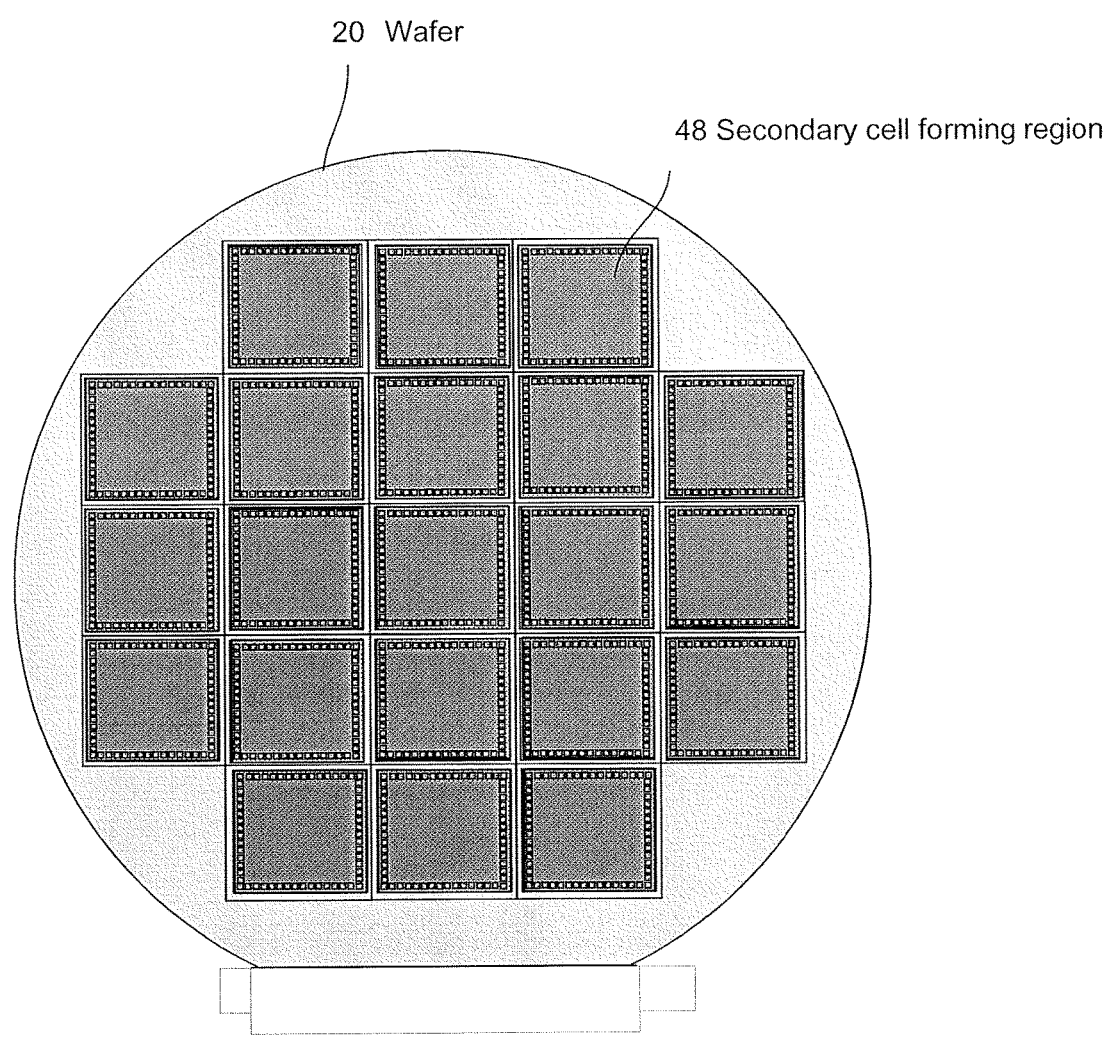
FIG. 6 is a view illustrating the oxide semiconductor secondary cells formed on the wafer after being separated corresponding to the respective chips.

In FIG. 6, after the oxide semiconductor secondary cell is formed at the secondary cell forming region 48, a region of the formed oxide semiconductor secondary cell corresponding to the respective chips is kept and other regions not corresponding to the respective chips thereof are eliminated.

The oxide semiconductor secondary cells exist only at the regions corresponding to the chips 22. If the chip 22 on which an oxide semiconductor secondary cell is not to be mounted exists, the oxide semiconductor secondary cell corresponding to that region is eliminated. In such a case, the chip 22 on which an oxide semiconductor secondary cell is not mounted becomes to exist.

Next, description will be provided on a method for manufacturing a chip on which an oxide semiconductor secondary cell is mounted according to the present invention.

Figure 7:
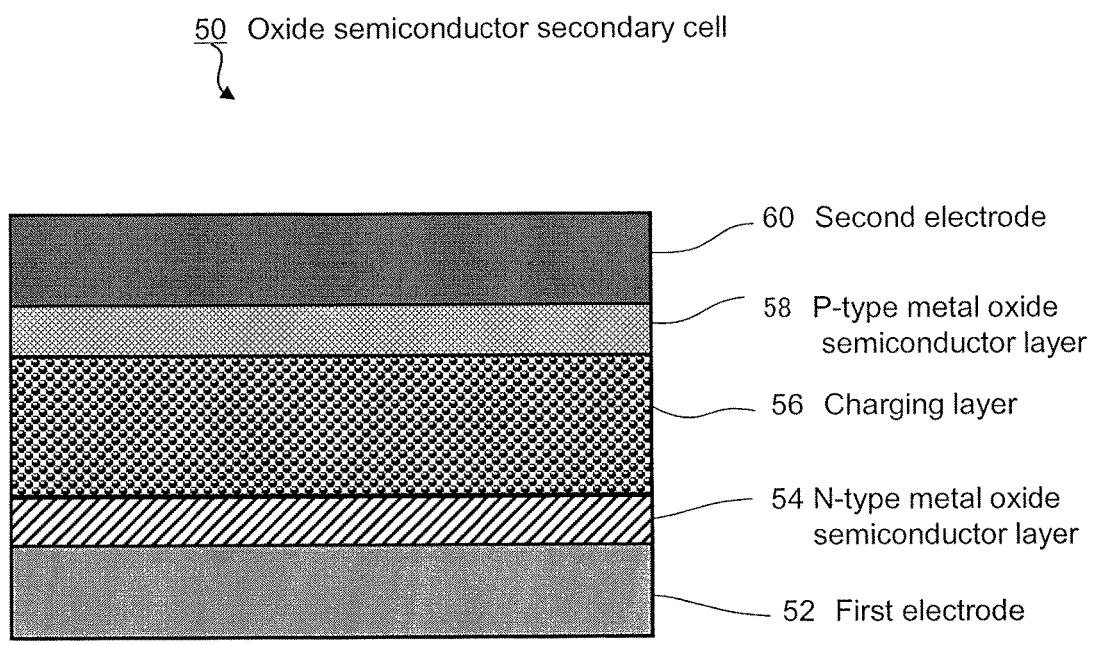
FIG. 7 is a view illustrating a specific example of the oxide semiconductor secondary cell to be formed on the wafer.

FIG. 7 illustrates a specific example of an oxide semiconductor secondary cell to be mounted on a chip.

In FIG. 7, an oxide semiconductor secondary cell 50 has a layer structure that an n-type metal oxide semiconductor layer 54, a charging layer 56 that stores charges, a p-type metal oxide semiconductor layer 58, and a second electrode 60 are layered on a first electrode 52 in the order thereof. In this case, the charging function layer 14 illustrated in FIG. 1 is structured as a layer unit of the n-type metal oxide semiconductor layer 54, the charging layer 56, and the p-type metal oxide semiconductor layer 58.

The first electrode 52 and the second electrode 60 are conductive films. For example, aluminum and the like used in a general semiconductor manufacturing process may be used as a material of the first electrode 52 and the second electrode 60. Sputtering to a substrate may be a forming method therefor. Here, another metal material and another forming method may be adopted as long as forming temperature thereof has little influence on an object on which mounting is performed (in this case, an semiconductor integrated circuit and the like).

For example, titanium oxide or the like may be used as a material for the n-type metal oxide semiconductor layer 54.

The charging layer 56 is a layer formed of an insulating material and an n-type metal oxide semiconductor. For example, titanium oxide, tin oxide, zinc oxide, or the like may be used as the n-type metal oxide semiconductor to be filled. Here, titanium oxide is preferable thereas. For example, silicon oil may be used as the insulating material. The charging layer 56 is formed by mixing aliphatic acid titanium and silicon oil and performing burning at a temperature between 350° C. and 400° C. after coating. Thereafter, the charging layer 56 is irradiated with ultraviolet, so that charging capacity can be increased.

For example, nickel oxide or the like may be used as a material of the p-type metal oxide semiconductor layer 58.

Next, description will be provided on a method for manufacturing a chip on which an oxide semiconductor secondary cell is mounted according to the present invention. In this description, the oxide semiconductor of FIG. 7 is mounted on the wafer 20 as an example.

Figure 8:
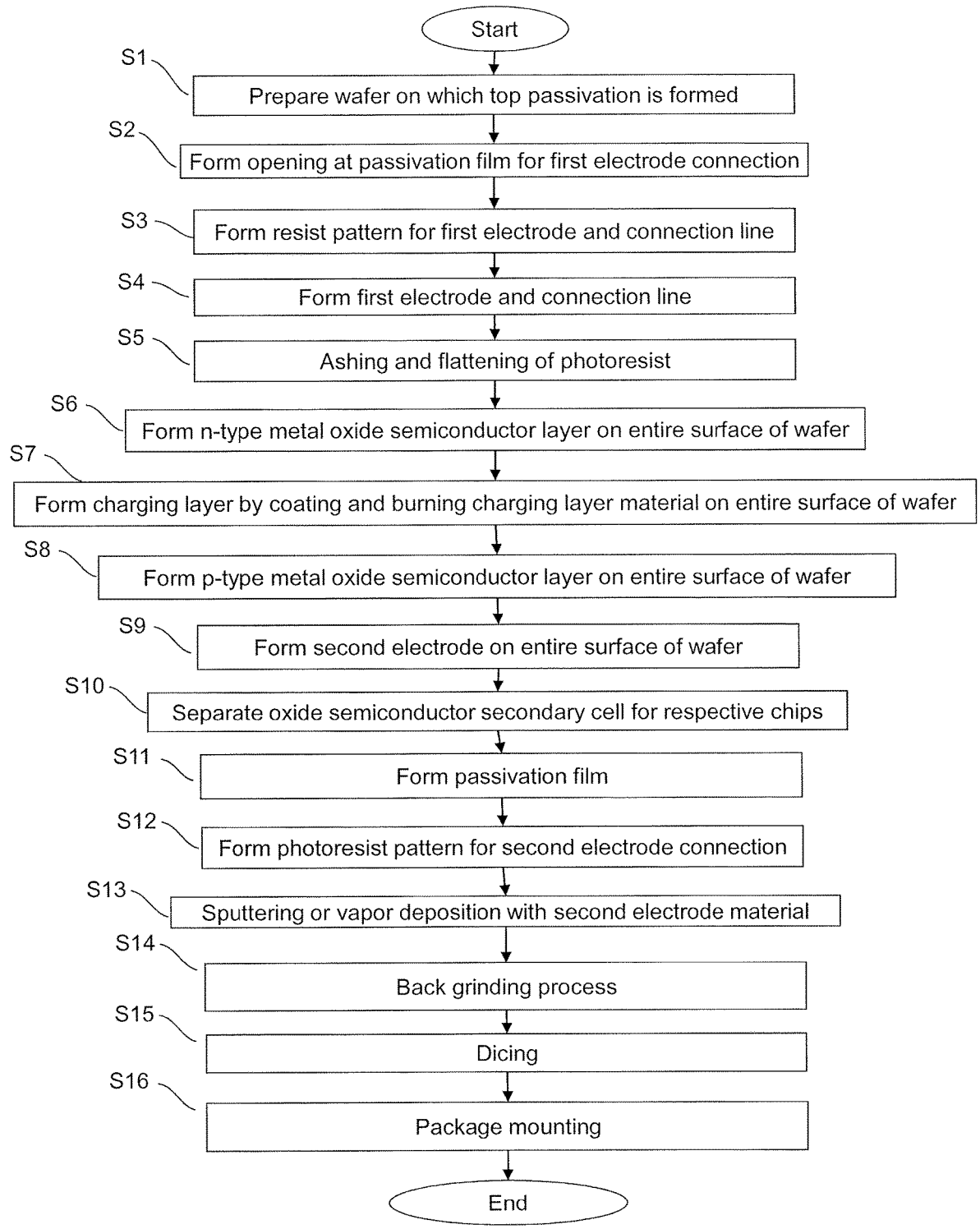
FIG. 8 is a flowchart of a method for manufacturing a chip on which an oxide semiconductor secondary cell is mounted.

FIG. 8 is a flowchart indicating a method for manufacturing a chip on which an oxide semiconductor secondary cell is mounted according to the present invention.

FIGS. 9 to 12 are views each illustrating a state of each chip in each manufacturing process.

Figure 9:
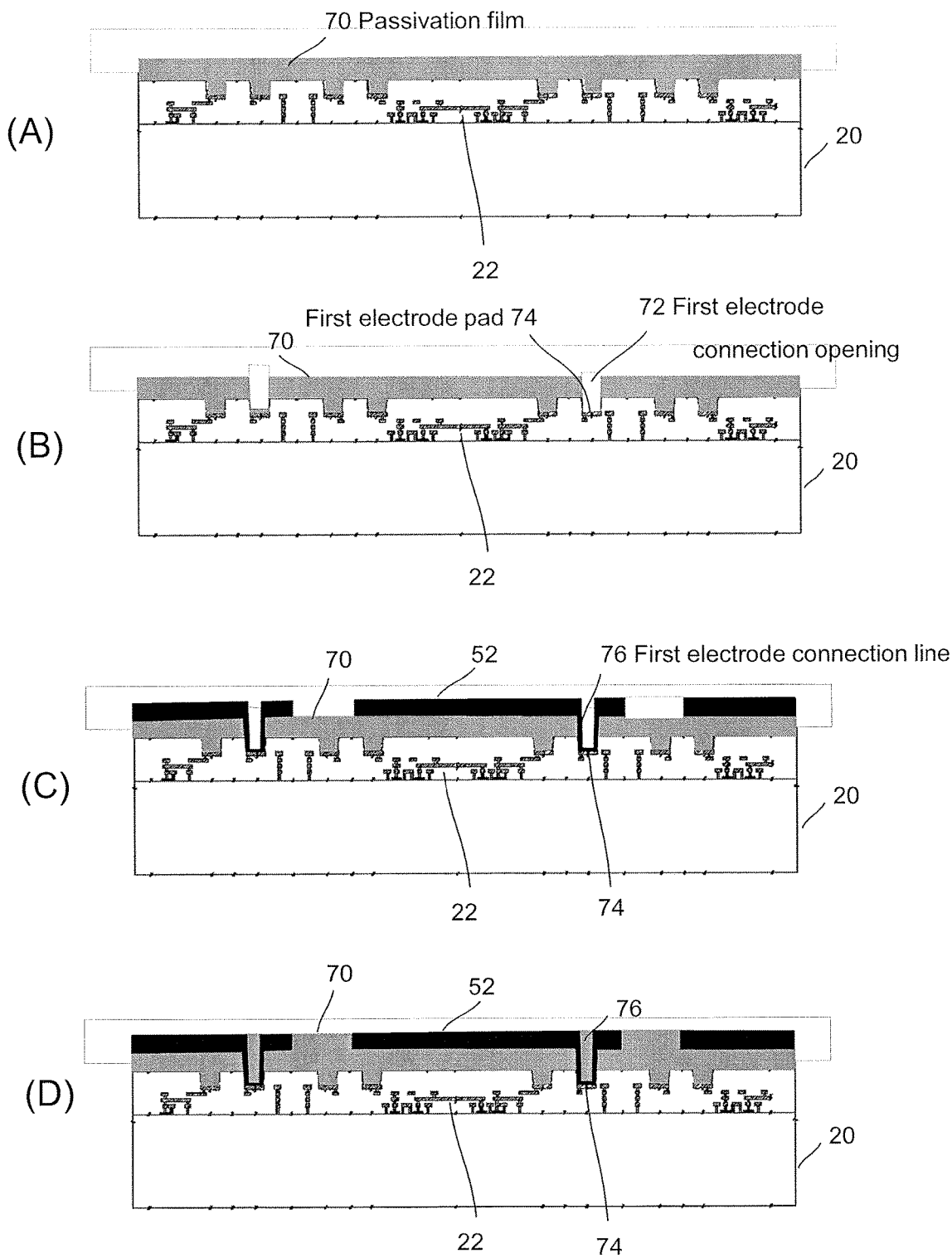
FIG. 9 is a view illustrating a manufacturing process for forming a first electrode and a first electrode connection line.
Figure 10:
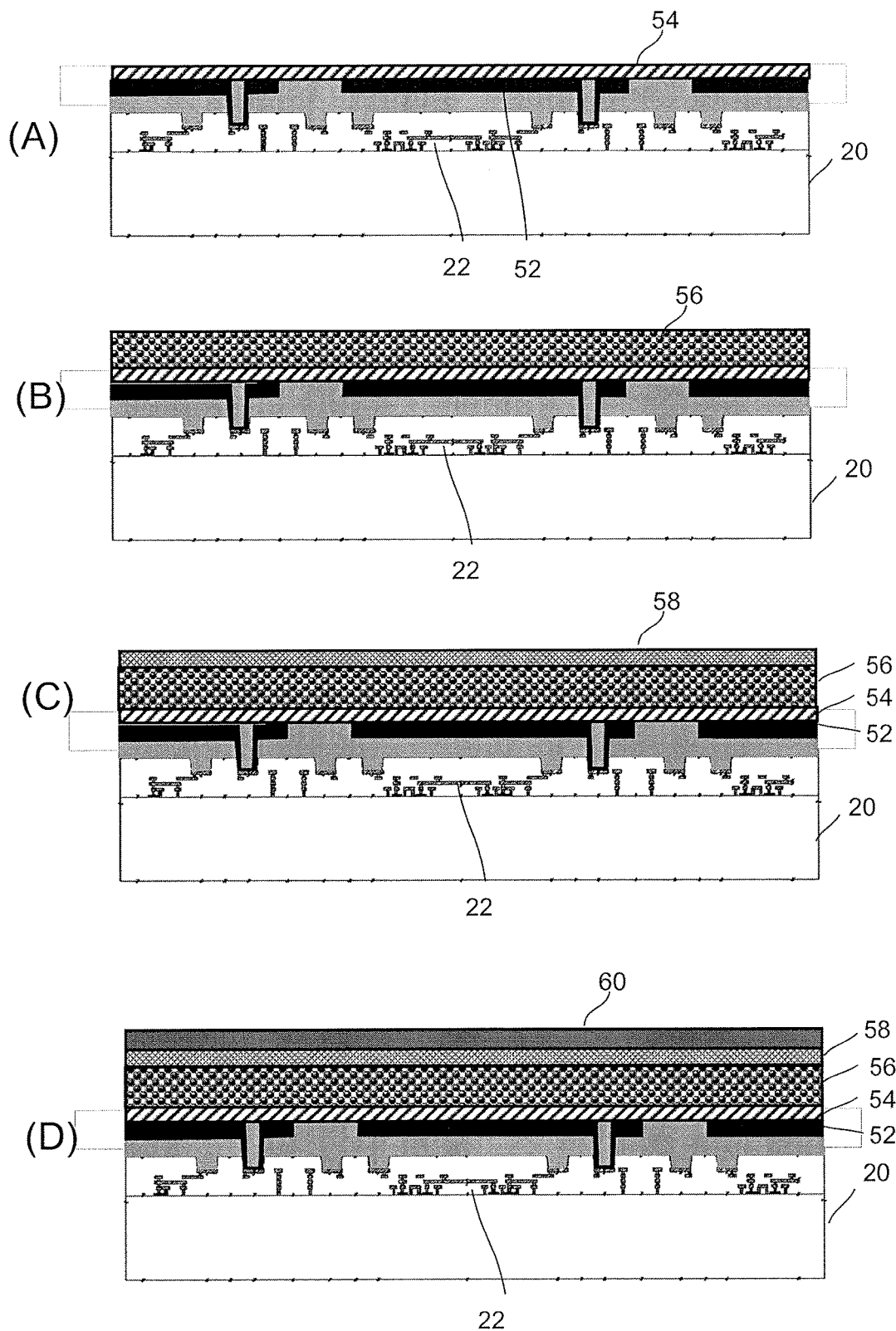
FIG. 10 is a view illustrating a manufacturing process for forming an oxide semiconductor secondary cell.
Figure 11:
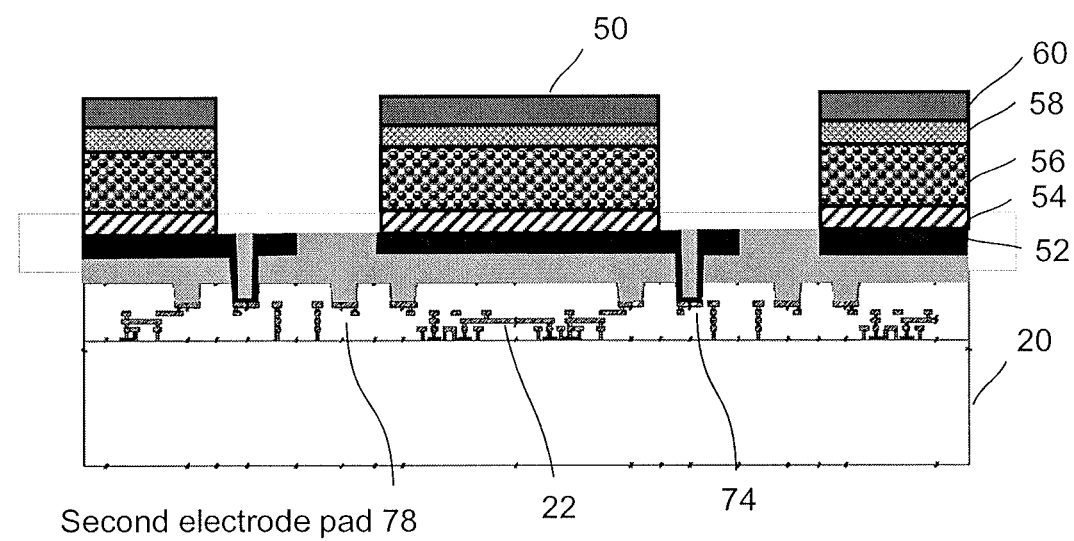
FIG. 11 is a view illustrating a separated state of the oxide semiconductor secondary cells.
Figure 12:
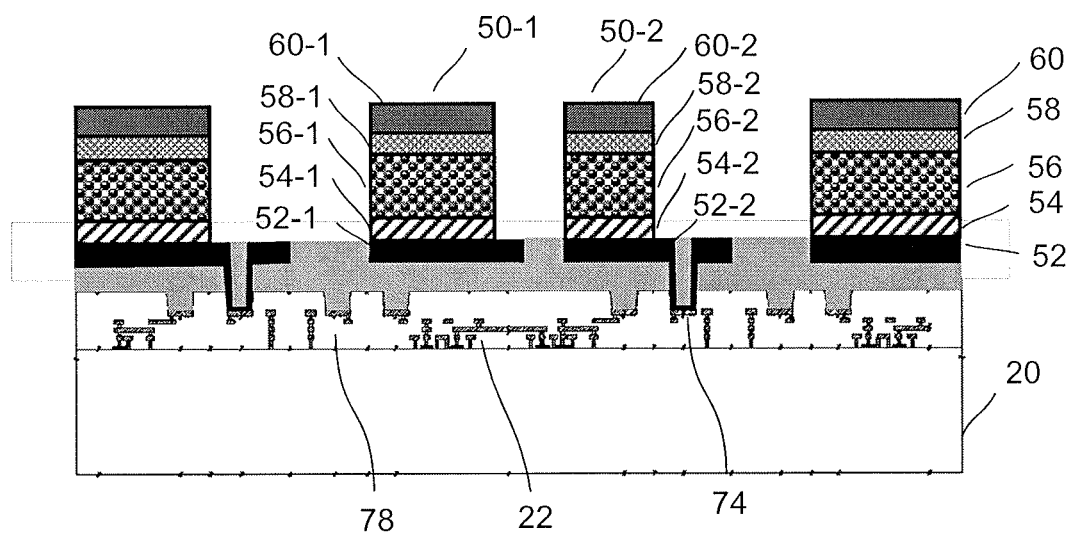
FIG. 12 is a view illustrating a separated state of the oxide semiconductor secondary cells on the chip.

FIG. 9 is a view illustrating a state of a chip in a process of forming the first electrode and a first electrode connecting line. FIG. 10 is a view illustrating a sectional structure of a chip in a process of forming a secondary cell. FIG. 11 is a view illustrating a state of a chip in a process of separating a secondary cell and manufacturing a passivation film. FIG. 12 is a view illustrating a chip in a manufacturing process for forming a second electrode connecting line for a second electrode.

In the following, based on the flowchart of FIG. 8 indicating the method for manufacturing a chip on which an oxide semiconductor secondary cell is mounted according to the present invention, the manufacturing method will be described with reference appropriately to FIGS. 9 to 12.

In FIG. 8, first, a wafer on which antecedent processes has completed is prepared in step S1. FIG. 9(A) illustrates the wafer 20 having a passivation film 70 formed on the chip 22. The passivation film 70 is formed on the entire surface of the wafer. Here, the surface of the passivation film 70 is flattened with polishing or the like.

In step S2, a region of the passivation film 70 corresponding to a first electrode pad 74 of the chip 22 is opened. The first electrode pad 74 is connected to the first electrode.

FIG. 9(B) illustrates a state that a first electrode connection opening 72 is arranged at the passivation film 70 corresponding to the first electrode pad 74 of the chip 22 to be connected to the first electrode. The opening of the passivation film 70 is arranged by performing patterning with masking using a resist pattern excepting the first electrode connection opening 72 and removing with etching the passivation film 70 existing in the region to be the first electrode connection opening 72. The etching may be performed as either wet etching or dry etching. The resist pattern is eliminated after the etching is performed. It is also possible to concurrently perform flattening and opening-forming using photosensitive polyimide.

In step S3, a photoresist pattern is formed on the passivation film 70 for forming a metal thin film for the first electrode and the first electrode connection line. The photoresist pattern is formed, for example, by photolithography. Here, photoresist (photosensitive resin) is coated on the wafer, the region other than the first electrode forming region is irradiated with light to transform the resin, and the untransformed portion is melted with developing fluid. Coating of the photoresist is performed with spin coating and baking. Then, developing is performed with irradiation with light (ultraviolet) using an exposure apparatus and the photoresist at portions other than the irradiated portion is eliminated. Since a liftoff process is adopted, a negative resist for facilitating to obtain a reversely-tapered shape is used.

Subsequently, in step S4, the first electrode and the first electrode connection line are formed with sputtering, vapor deposition, or the like using a conductive electrode material. Titanium, aluminum, or alloy thereof may be used as the electrode material.

In step S5, the first electrode and the first electrode connection line are formed by eliminating the photoresist with an organic solvent.

FIG. 9(C) illustrates a state that the first electrode 52 and a first electrode connection line 76 are formed. The first electrode connection line 76 is formed of a metal material at a side face portion of the first electrode connection opening 72 of the passivation film 70 and is connected to the first electrode pad 74 that is to be connected to the first electrode. The first electrode 52 and the first electrode connection line 76 may be concurrently formed.

After the first electrode 52 and the first electrode connection line 76 are formed, the passivation film 70 is thickened so that the first electrode pad 74 is covered and a stepped part between the passivation film 70 and the first electrode 52 is flattened. According to the above manufacturing process, the first electrode pad 74 is protected by the passivation film 70.

After the first electrode 52 is formed, an insulating film is formed and an opening is formed at a part thereof at the secondary cell forming region.

It is preferable that the same material as the passivation film 70 is used as the insulating film material. However, it is also possible to use another material. For example, $SO_2$ or SiN may be used as the material of the passivation film 70. Subsequently, masking is performed with a resist pattern on portions other than the region corresponding to the first electrode 52 and the region corresponding to the first electrode 52 is eliminated with etching. The etching may be performed as either wet etching or dry etching. The resist pattern is eliminated after the etching is performed. The opening may be formed using photosensitive polyimide instead of resist.

Regarding the flattening process, flattening may be performed by using methods such as mechanical polishing and chemical-mechanical polishing in combination.

In step S6, the n-type metal oxide semiconductor layer 54 is formed on the entire surface of the flattened wafer. Forming the n-type metal oxide semiconductor layer 54 is performed by forming the n-type metal oxide semiconductor 54 with sputtering or the like. Since the forming is performed on the entire of the wafer, it is not required to perform patterning and ashing.

In step S7, a material for the charging layer is coated on the entire surface of the wafer and burning is performed with heating. Since the material for the charging layer is in a liquid form as being obtained by mixing aliphatic acid titanium and silicon oil, the charging layer can be formed with coating. Accordingly, an even charging layer can be manufactured in a short period of time. Regarding the coating, the charging layer is formed on the entire surface of the wafer with a spin coating method as dropping the liquid charging layer material while the wafer is rotated at high speed. Subsequently, burning with heating is performed on the charging layer at a temperature between 350° C. and 400° C. Subsequently, the burned charging layer is irradiated with ultraviolet and conductivity of the charging layer is varied.

In step S8, the p-type metal oxide semiconductor layer 58 is formed on the entire surface of the wafer with sputtering or the like. Subsequently, in step S9, the second electrode is formed on the entire surface of the wafer with sputtering or the like.

FIG. 10 illustrates states in which the respective layers of the oxide semiconductor secondary cell are formed in steps S6 to S9.

FIG. 10(A) illustrates a state that the n-type metal oxide semiconductor layer 54 is formed on the surface flattened in step S5. FIG. 10(B) illustrates a state that the charging layer 56 is formed on the upper face of the n-type metal oxide semiconductor layer 54. FIG. 10(C) illustrates a state that the p-type metal oxide semiconductor layer 58 is formed on the upper face of the charging layer 56. FIG. 10(D) illustrates a state that the second electrode 60 is formed on the upper face of the p-type metal oxide semiconductor layer 58.

As is clearly seen from FIG. 10, owing to that the flattening process has been performed, the n-type metal oxide semiconductor layer 54, the charging function layer 56, and the p-type metal oxide semiconductor layer 58 that form the secondary cell can be formed respectively to have even thickness. Accordingly, variation of the chips can be suppressed.

In step S10, the oxide semiconductor secondary cell collectively formed on the wafer is separated for respective chips. The separation is performed by eliminating unnecessary regions with etching. At that time, for a chip on which the oxide semiconductor secondary cell is not required to be mounted, the oxide semiconductor secondary cell at a region corresponding to the chip is eliminated. The oxide semiconductor secondary cell mounted on a chip may be further separated into pieces. In this case, when the oxide semiconductor secondary cells separated into pieces are connected in series, it is possible to increase a supply voltage for a predetermined chip. Further, it is also possible that some of the separated oxide semiconductor secondary cells is caused to exist independently (i.e., without being used as a power source for the integrated circuit) on a chip and is to be used as a power supply source to another electronic element existing on a portion other than the chip.

Regarding the etching for the separation, masking is performed with a resist pattern on a region where the oxide semiconductor secondary cell is required to be kept, that is, a region corresponding to each chip, and dry etching is performed using a gas that corresponds to each layer. For example, chlorine-based dry etching such as HBr and Cl or a fluorine-based gas such as CF4 and CHF3 may be adopted.

FIG. 11 illustrates a state that the oxide semiconductor secondary cell 50 collectively formed on the wafer is separated for the respective chips 22. The oxide semiconductor secondary cell on which the first electrode 52, the n-type metal oxide semiconductor layer 54, the charging layer 56, the p-type metal oxide semiconductor layer 58, and the second electrode 60 are layered in the order thereof is formed as corresponding to each chip 22. Each oxide semiconductor secondary cell is an independent oxide semiconductor secondary cell as being separated from other chips 22. A region corresponding to the first electrode connection pad 74 and a region corresponding to a second electrode connection pad 78 of the chip 22 are not included in the secondary cell forming region.

FIG. 12 illustrates a state that the oxide semiconductor secondary cell mounted on the chip 22 is further separated.

FIG. 12 illustrates a state that the oxide semiconductor secondary cell 50 formed at the center of the chip 22 (see FIG. 11) is separated into an oxide semiconductor secondary cell 50-2 corresponding to the first electrode connection pad 74 and an oxide semiconductor secondary cell 50-1 corresponding to the second electrode connection pad 78 of the chip 22. The first electrode 52 is separated into a first electrode 52-1 and a first electrode 52-2 in advance in the first electrode forming process. In the process of separating the oxide semiconductor secondary cell, the n-type metal oxide semiconductor layer 54 is separated into an n-type metal oxide semiconductor layer 54-1 and an n-type metal oxide semiconductor layer 54-2. The charging layer 56 is separated into a charging layer 56-1 and a charging layer 56-2. The p-type metal oxide semiconductor layer 58 is separated into a p-type metal oxide semiconductor layer 58-1 and a p-type metal oxide semiconductor layer 58-2. Further, the second electrode 60 is separated into a second electrode 60-1 and a second electrode 60-2. The separation described above may be performed with the manufacturing process being the same as the separation process of the oxide semiconductor secondary cell.

Figure 13:
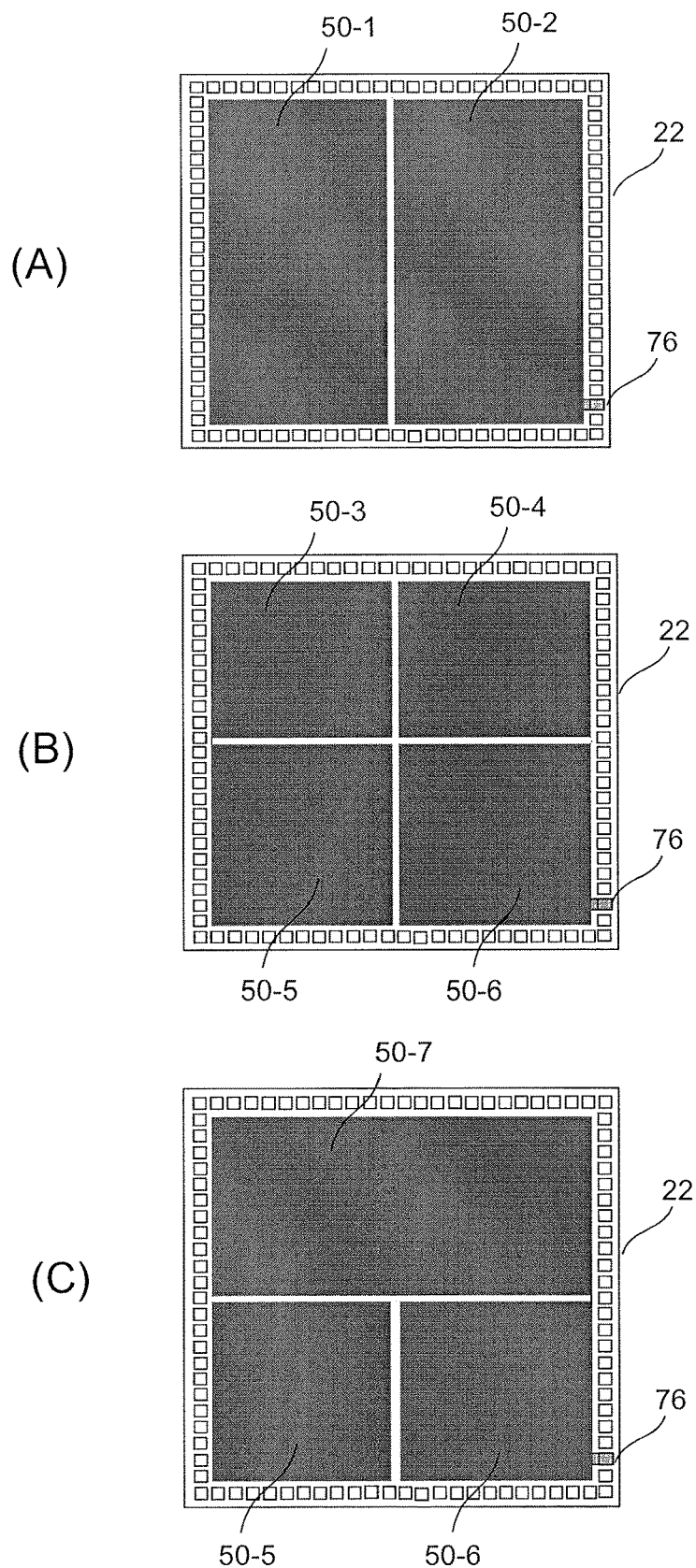
FIG. 13 is a view illustrating examples of a variety of separation shapes of the oxide semiconductor secondary cells.

FIG. 13 illustrates a variety of examples of a separation shape of the oxide semiconductor secondary cell mounted on the chip 22.

A variety of shapes may be adopted for the separation of the oxide semiconductor secondary cell mounted on the chip 22. For example, in FIG. 13(A), the oxide semiconductor secondary cell is separated into two pieces as being the oxide semiconductor secondary cell 50-1 and the oxide semiconductor secondary cell 50-2. In FIG. 13(B), the oxide semiconductor secondary cell is separated into four pieces as being an oxide semiconductor secondary cell 50-3, an oxide semiconductor secondary cell 50-4, an oxide semiconductor secondary cell 50-5, and an oxide semiconductor secondary cell 50-6. In FIG. 13(C), the oxide semiconductor secondary cell is separated into three pieces as being an oxide semiconductor secondary cell 50-5, an oxide semiconductor secondary cell 50-6, and an oxide semiconductor secondary cell 50-7. In FIG. 13 (C), it is separated into three secondary cells while the two oxide semiconductor secondary cells (50-3 and 50-4) illustrated in FIG. 13(B) form the single oxide semiconductor secondary cell 50-7 without being separated. The separation shapes of the oxide semiconductor secondary cell mounted on the chip 22 are not limited to the shapes illustrated in FIG. 13.

Figure 14:
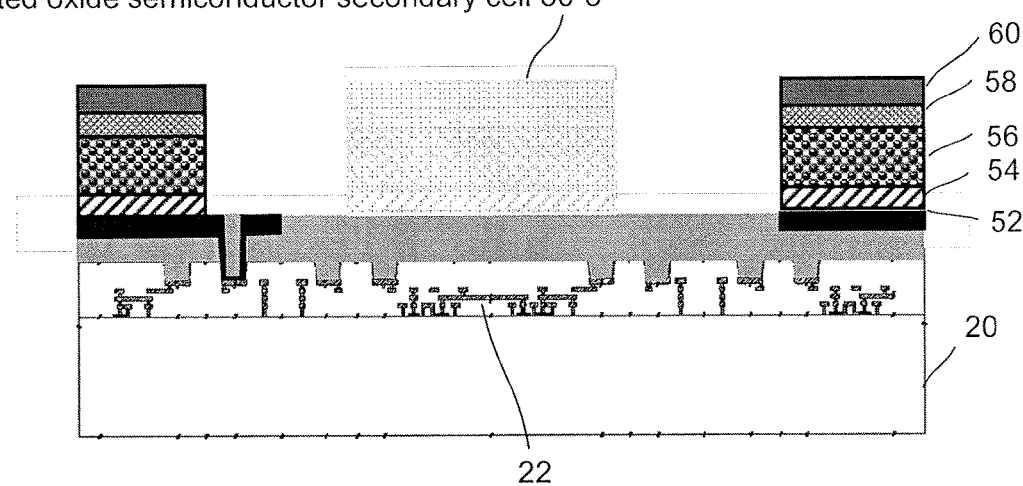
FIG. 14 is a view illustrating a chip on which an oxide semiconductor secondary cell is not mounted.

FIG. 14 illustrates a state after an oxide semiconductor secondary cell 50-8 on the chip 22 on which an oxide semiconductor secondary cell is not required to be mounted is eliminated in the separation process.

The first electrode 52 is not formed as well on the chip 22 on which an oxide semiconductor secondary cell is not required to be mounted. The oxide semiconductor secondary cell 50-8 existing at a region of the chip 22 on which an oxide semiconductor secondary cell is not required to be mounted is eliminated in the separation process. Eliminating the oxide semiconductor secondary cell 50-8 is performed simply due to non-masking with a resist pattern as the manufacturing process being the same as the separation process of the oxide semiconductor secondary cell.

The oxide semiconductor secondary cell 50 is formed on the chip 22 with the abovementioned manufacturing processes. Further, it is required to perform processes of forming a protection film and connecting the second electrode 60 to the second electrode pad 78 of the chip 22.

In step S11, a passivation film is formed at a region to cover the second electrode 60 as a protection film. The passivation film is formed of an insulating material over the entire surface of the wafer. It is preferable that the same material as the passivation film for the chip is used as the insulating material. However, it is also possible to use another material. For example, $SO_2$, SiN, or polyimide may be used as the insulating material.

Subsequently, masking is performed with a resist pattern on portions other than the region corresponding to the second electrode 60 and the passivation film existing at the region corresponding to the second electrode 60 is eliminated with etching. The etching may be performed as wet etching using appropriate chemical fluid such as mixed acid or dry etching using fluorine series such as CF4 and CHF. The resist pattern is eliminated after the etching is performed.

Figure 15:
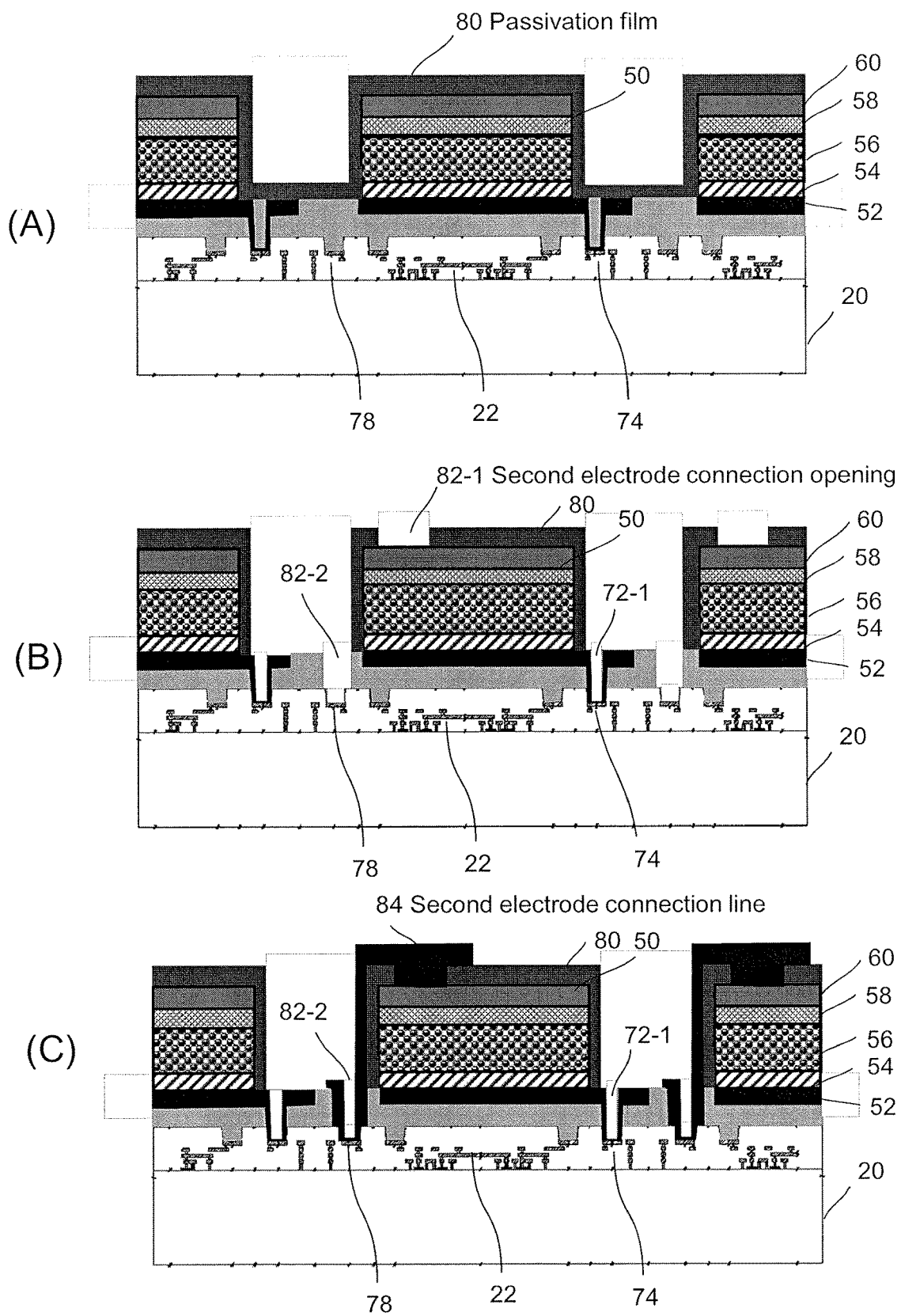
FIG. 15 is a view illustrating a manufacturing process for forming a second electrode and a second electrode connection line.

FIG. 15(A) illustrates the chip 22 on which a passivation film 80 is formed on the wafer 20 that includes the oxide semiconductor secondary cell 50.

Since the passivation film 80 is formed on the entire surface of the wafer, it is required to form, at the passivation film 80, an opening for connecting the second electrode 60 of the oxide semiconductor secondary cell 50 to the second electrode pad 78 of the chip 22 and an opening for the electrode pad portion of the chip 22.

FIG. 15(B) is a view illustrating a state that openings are formed at the passivation film 80.

As the openings, a second electrode connection opening 82-1 is formed on the upper part of the second electrode 60 of the oxide semiconductor secondary cell 50, a second electrode connection opening 82-2 is formed at the upper part of the secondary pad 78, and a first electrode connection opening 72-1 is formed at the upper part of the first electrode pad 74. Further, it is required to form an opening for wire bonding on the upper part of the electrode pad 26 of the chip 22.

Regarding the openings, masking is performed with a resist pattern on regions where openings are not to be formed and etching may be performed as wet etching or dry etching. The resist pattern is eliminated after the etching is performed.

Subsequently, in step S12, a photoresist pattern for second electrode connection is formed on the passivation film 80. The photoresist pattern is formed by photolithography as being with the same method for forming the first electrode 52. Since a liftoff process is adopted, a negative resist for facilitating to obtain a reversely-tapered shape is used.

Subsequently, in step S13, a second electrode connection line 84 is formed by causing a conductive electrode material to adhere with sputtering or vapor deposition. Titanium, aluminum, or alloy thereof may be used as the electrode material. Thereafter, the photoresist formed in step S12 is eliminated with ashing using oxygen plasma.

FIG. 15(C) illustrates a chip on which an oxide semiconductor secondary cell with the second electrode connection line 84 formed is mounted. The second electrode connection line 84 connects the second electrode 60 and the second electrode pad 78 of the chip 22. The second electrode connection line 84 is insulated from other layers of the oxide semiconductor secondary cell via the passivation film 80.

Figure 16:
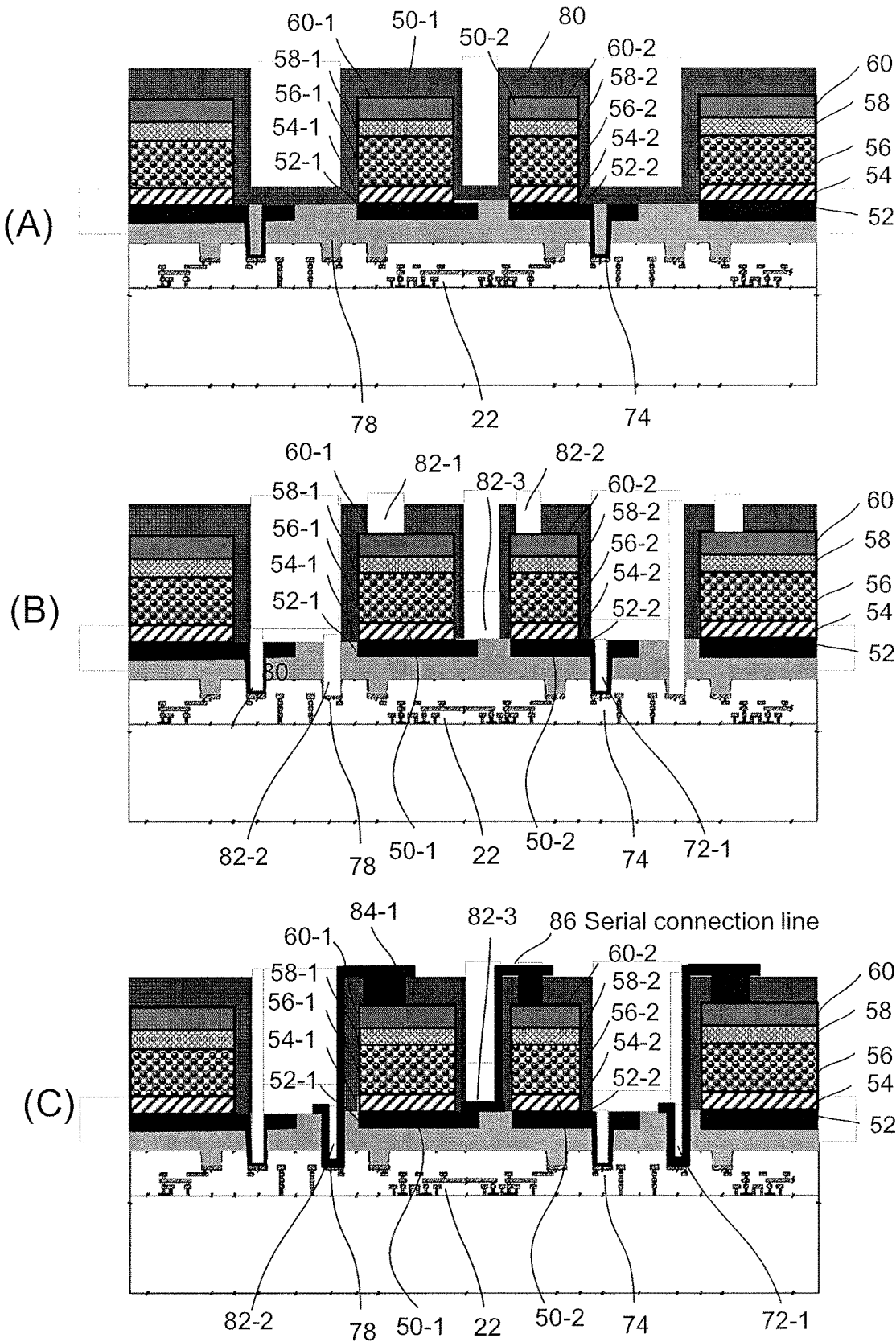
FIG. 16 is a view illustrating a manufacturing process for forming a serial connection line and the second electrode connection line.

FIG. 16 illustrates a chip on which two oxide semiconductor secondary cells being the oxide semiconductor secondary cell 50-1 and the oxide semiconductor secondary cell 50-2 are mounted while the oxide semiconductor secondary cell formed on the chip 22 is further separated. FIG. 16(A) illustrates a state that the passivation film 80 is formed. FIG. 16(B) illustrates a state that openings are formed at the passivation film 80 formed as in FIG. 16(A). Since the passivation film 80 is formed also on the region where the oxide semiconductor secondary cell is separated into the oxide semiconductor secondary cell 50-1 and the oxide semiconductor secondary cell 50-2, an opening 82-3 is formed as well on the region of the separation into the oxide semiconductor secondary cell 50-1 and the oxide semiconductor secondary cell 50-2, as illustrated in FIG. 16(B). Naturally, since the oxide semiconductor secondary cell is separated into the oxide semiconductor secondary cell 50-1 and the oxide semiconductor secondary cell 50-2, there are formed an opening 82-1 corresponding to the second electrode 60-1 and an opening corresponding to the second electrode 60-2.

FIG. 16(C) illustrates a state that a second electrode connection line 84-1 and a serial connection line 86 are formed. The second electrode connection line 84-1 is formed at a region that includes the opening 82-3. The second electrode connection line 84-1 connects the second electrode 60-1 and the second electrode pad 78. The serial connection line 86 causes the two oxide semiconductor secondary cells 50-1, 50-2 to be connected in series by connecting the first electrode 52-1 and the second electrode 60-2. That is, according to the serial connection line 86, the oxide semiconductor secondary cell having a twofold voltage value is actualized.

Regarding the separated oxide semiconductor secondary cells, all the oxide semiconductor secondary cells are not necessarily required to be connected in series. For example, in FIG. 13(C), the oxide semiconductor secondary cell 50-7 may be independent from the chip 22 without being connected to the chip 22 and the oxide semiconductor secondary cells 50-1, 50-2. In this case, the oxide semiconductor secondary cell 50-7 may be used for power supplying to another electronic element.

In step S3 and step S12, the forming is performed with a lithographic method using a photoresist pattern. However, it is also possible to obtain the same effects with a printing technology. Examples of the printing technology include screen, gravure, and ink-jet.

A chip on which an oxide semiconductor secondary cell is mounted is completed with the abovementioned manufacturing processes. Here, a protection film that covers the chip on which the oxide semiconductor secondary cell is mounted may be further formed as required.

In a preceding process to form a chip on a wafer, a thick wafer is used to prevent the wafer from being broken during the manufacturing process. For example, a wafer having a diameter of 300 mm has a thickness of 775±25 µm. The thickness is too thick for an integrated circuit chip. Accordingly, the wafer is grinded and thinned with a back grinding process in step S14. The back grinding process is performed on a back face of the wafer. Here, grinding is performed with a dice to which diamond is attached at a cutting edge thereof. Normally, it is finished to have thickness of about 300 µm.

Dicing is performed in step S15 on the wafer on which the back grinding process has been performed to have separated chips each having an oxide semiconductor secondary cell mounted thereon. As the dicing, cutting is performed on a scribe region 44 with a diamond cutter or the like.

Further, the chip on which diced oxide semiconductor secondary cell is mounted is packaged in step S16. Ag paste is coated on a lead frame to be packaged, the chip on which the oxide semiconductor secondary cell is mounted is scrubbed and bonded thereto, and the chip is fixed as curing the Ag paste. The electrode pads of the chip and external electrodes of the lead frame are connected with wire bonding. Then, sealing is performed with molding, so that the chip on which the oxide semiconductor secondary cell is mounted is completed.

In addition to a function as a backup power source in case of power outage or power stoppage, the chip on which the oxide semiconductor secondary cell is mounted has a function to improve a slew rate while supplying power in accordance with load variation of an integrated circuit.

Figure 17:
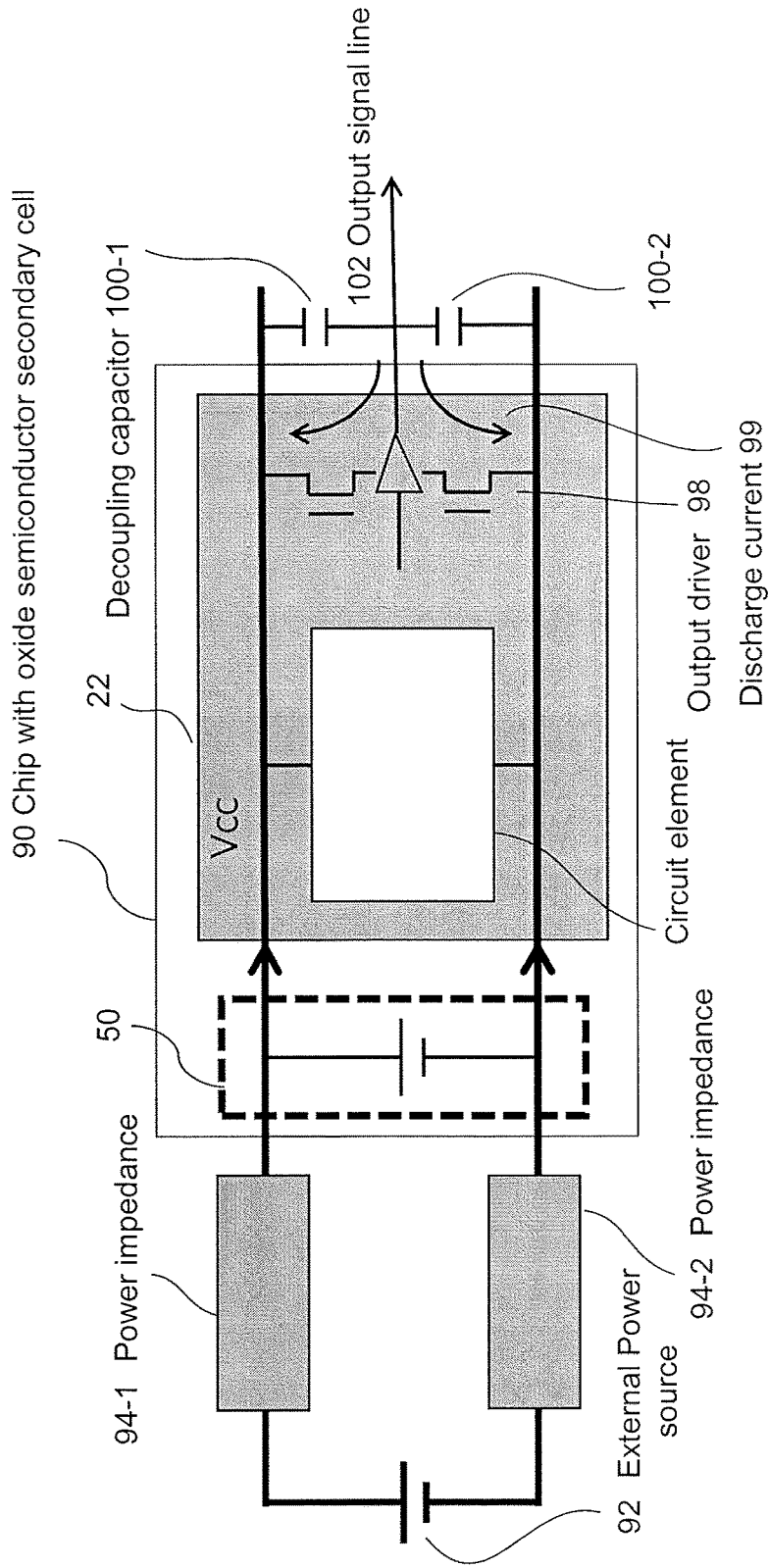
FIG. 17 is a view illustrating a state that a chip on which an oxide semiconductor secondary cell is mounted is connected to a power source.

FIG. 17 is a view equivalently illustrating a state that an external power source 92 is connected to a chip 90 with an oxide semiconductor secondary cell according to the present invention.

A power impedance 94-1 exists at a power line in wiring at a voltage supply side of the external power source 92. A power impedance 94-2 also exists at a ground line at a ground side thereof. In addition to such power wiring, the chip 22 is provided with a circuit element 96 such as a transistor and capacitor, and an output driver 98. It becomes into a state being equivalent to that capacitors are connected to an output signal line 102 due to capacitance of the wiring, terminal capacitance of a signal line receiving device, and the like. Accordingly, it becomes into a state being equivalent to that decoupling capacitors 100-1, 100-2 are connected. Discharge current 99 flows through the output driver 98 in accordance with ON-OFF of an output signal.

There may be a case that the decoupling capacitors 100-1, 100-2 are intentionally connected between a power source and the ground especially for reducing a power impedance at high frequencies.

A spike-like current flows through the power line and the ground line of the circuit element 96 in accordance with circuit operation. Since the current induces noise at the external power source 92 and causes a power voltage to fluctuate, the integrated circuit cannot stably operate to easily cause a problem in view of signal waveforms and noise generation.

Normally, a current to be consumed at the circuit element 96 flows through the power source of the chip 22. Here, at the power source of the chip 22, when an output signal level of the output signal line 102 is switched, a charging current for output capacitance flows at the time of switching from 0 to 1 and a discharging current flows at the time of switching from 1 to 0 through the signal line in a pulse-like manner. In accordance therewith, a current also flows through the power line and the ground line. In addition to the above currents, there may be a case that a through-current flows for only a moment at the time of signal switching from the power source to the ground of the output driver 98. The through-current also constitutes a factor of that a pulse-like current flows through the power line and the ground line.

Figure 18:
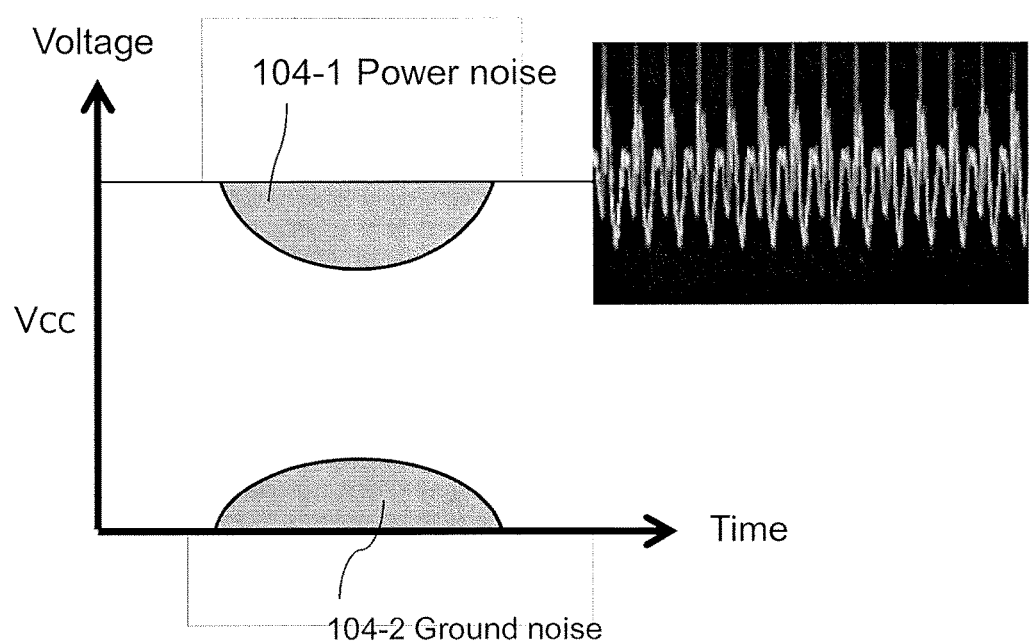
FIG. 18 is a view illustrating power noise.

FIG. 18 illustrates a state that a power noise 104-1 occurs at the power line and a ground noise 104-2 occurs at the ground line and illustrates a measurement example of the power noise as well.

The currents are sharply pulsed as including an extremely wide range of frequency components. Accordingly, emittance of a part of the energy to the outside may cause a noise failure. Further, sharp current fluctuation causes fluctuation of power voltages due to the power impedances 94-1, 94-2 of patterns of the power line and the ground line, so that operation of peripheral circuits using the same external power source 92 becomes unstable.

Figure 19:
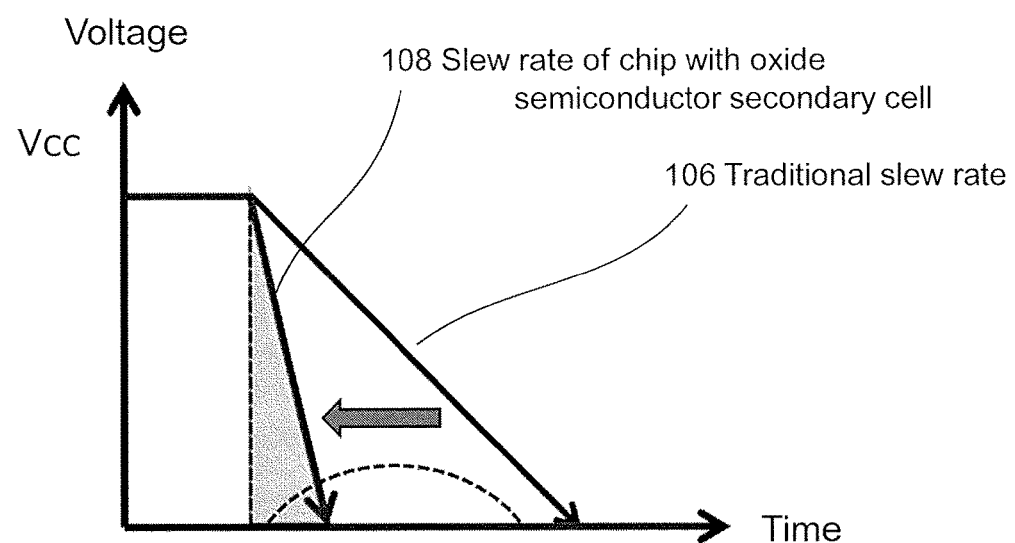
FIG. 19 is a view illustrating an improvement effect of a slew rate.
Figure 20:
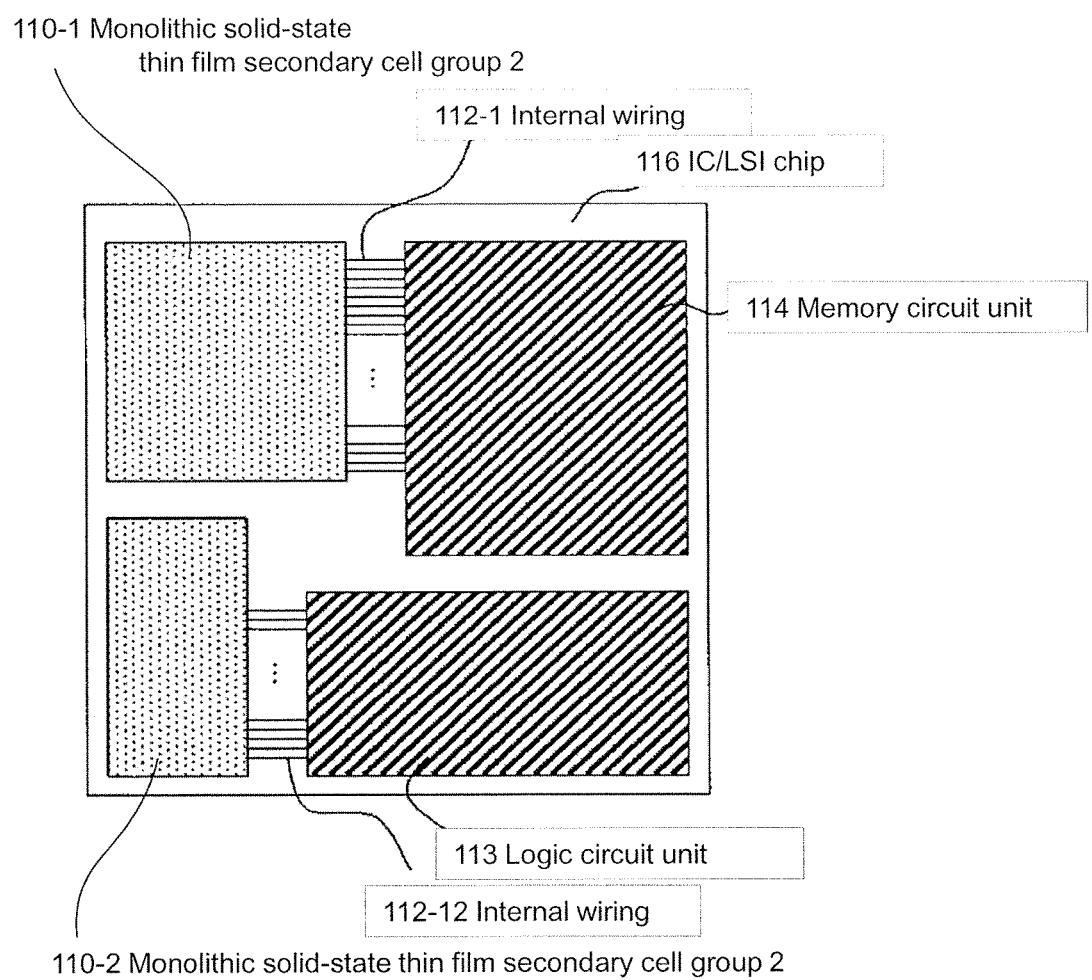
FIG. 20 is a view illustrating an example in the related art.
Figure 21:
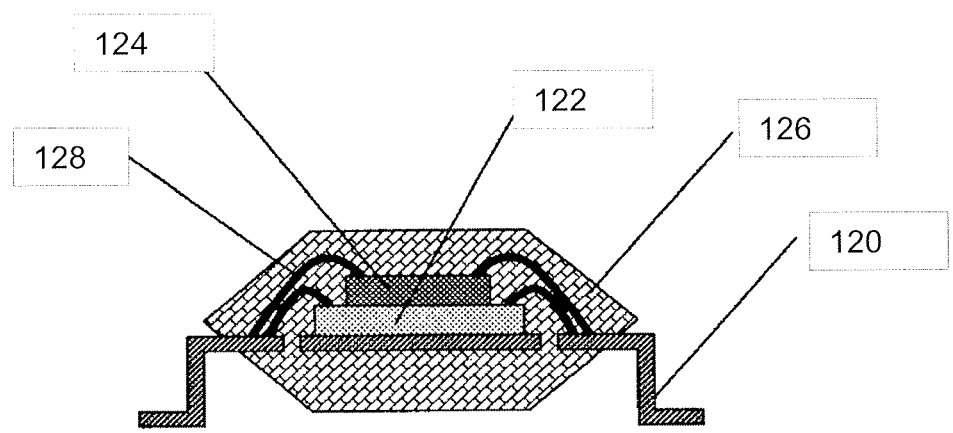
FIG. 21 is a view illustrating an example in the related art.

FIG. 19 is a view illustrating an improvement effect of a drop time of a signal in the chip 90 with the oxide semiconductor secondary cell according to the present invention.

A drop time of a traditional slew rate 106 has been long under the influence of the power impedances 94-1, 94-2, the power noise 104-1, and the ground noise 104-2. In contrast, according to the chip 90 with the oxide semiconductor secondary cell according to the present invention, since the oxide semiconductor secondary cell is mounted directly on the chip 22, a power impedance for the chip 22 is small to the extent being negligible while having sufficient power supply capacity to load fluctuation. Accordingly, as illustrated in FIG. 19, a slew rate 108 of the chip 90 with the oxide semiconductor secondary cell can have a drastically-shortened drop time. The improvement effect of the slew rate 108 of the chip 90 with the oxide semiconductor secondary cell is noticeable against the traditional slew rate 106.

In the related art, when an external power source (e.g., a cell that is not mounted directly on the chip 22) and a chip are connected, there exists a power impedance of the power source for the chip. Accordingly, when the chip performs operation that consumes large power, power supply cannot follow thereto from the external power source. The above has been a factor to cause slew rate reduction and power noise occurrence.

In contrast, in the chip 90 with the oxide semiconductor secondary cell, the oxide semiconductor secondary cell is layered on the chip. Here, when power supply shortage form the external power source occurs, power is supplied from the oxide semiconductor secondary cell having a small power impedance. Accordingly, even when the chip performs operation that consumes a large power, the power is supplied therefrom, so that slew rate reduction and power noise occurrence can be suppressed.

Example

To form a passivation film on an 8-inch wafer where an integrated circuit was arranged, SOG was coated with spin coating on the wafer and curing was performed. The curing was performed at temperature of 350° C. or lower. Then, patterning was performed with a resist and an opening was formed with wet etching using mixed acid at the first electrode pad to which the first electrode is to be connected. Thereafter, an unnecessary resist was eliminated using an organic solvent.

Subsequently, portions other than the region where the first electrode connection line and the first electrode were formed were covered with a resist, a Ti metal film was formed as having a thickness of 500 nm, and the first electrode connection line and the first electrode were formed with liftoff. Thereafter, SOG was coated with spinning and cure was performed for flattening. Subsequently, wet etching was performed using mixed acid on a region where the oxide semiconductor secondary cell is to be formed, so that the SOG film on the first electrode was eliminated.

The n-type metal oxide semiconductor layer was formed by forming a film of $TiO_2$ with sputtering on the entire surface of the wafer. The thickness of the n-type metal oxide semiconductor layer was about 100 nm.

Subsequently, for forming the charging layer, mixed fluid of titanium oxide and silicon oil was coated with spinning coater on the wafer and was burned at a temperature between 300° C. and 400° C. Thereafter, the burned mixed fluid was irradiated with ultraviolet for 1.5 hours using a UV irradiating device.

The p-type metal oxide semiconductor layer was formed by forming a film of NiO with sputtering on the charging layer. The thickness of the p-type metal oxide semiconductor layer was about 200 nm.

Finally, the second electrode was formed by forming a film of Al with sputtering on the p-type metal oxide semiconductor layer. The thickness of the second electrode was about 300 nm.

According to the abovementioned manufacturing processes, the oxide semiconductor secondary cell was formed on the wafer. The oxide semiconductor secondary cell was formed as a single oxide semiconductor secondary cell on the entire surface of the wafer. Therefore, it is required to be separated into respective oxide semiconductor secondary cells corresponding to the respective chips. Accordingly, pattern etching was performed on the oxide semiconductor secondary cell using a resist.

Regarding the separation of the oxide semiconductor secondary cell, first, for etching aluminum of the second electrode, the electrode aluminum at portions other than portions where the charging layer is to be kept was eliminated by performing processing using mixed acid (phosphoric acid series). Subsequently, etching was performed on the NiO film (p-type metal oxide semiconductor layer) with RIE using a gas compound of alcohols and hydrocarbons. Then, etching was performed on the charging layer and the NiO film (n-type metal oxide semiconductor layer) with RIE using CH4 as a main gas.

To avoid occurrence of etching failure at phase boundaries of the respective layers being generated at the time of switching etching gasses, a cleaning process to eliminate remained sludge with cleaning fluid was performed. The process with cleaning fluid for eliminating remained sludge was performed as well after etching on the last $TiO_2$ film (n-type metal oxide semiconductor layer). Thereafter, unnecessary resist was eliminated with ashing and solvent series.

Subsequently, a protection film was formed at a low temperature by performing coating, drying, and irradiating with ultraviolet using a silicon-based material. The processing temperature was 150° C. or lower. Further, after patterning with the resist, openings were formed at predetermined portions for the second electrode pads by processing with mixed acid. Finally, the second electrode connection line that connects the second electrode and the second electrode pad was formed with liftoff.

A back grinding process was performed, and then, separation into the respective chips was performed with dicing. Further, the separated chip was mounted into a package, so that the chip with the oxide semiconductor secondary cell was completed.

The embodiments of the present invention are described in the above. Here, the present invention includes appropriate modifications thereof without departing from the objects and effects thereof and is not limited to the abovementioned embodiments.

For example, in the above description, the oxide semiconductor secondary cell is formed on the wafer 20 on which the plurality of chips 22 are formed. However, the manufacturing method of the present invention can be adopted even for a case that the oxide semiconductor secondary cell is formed on the wafer 20 on which a single chip 22 is formed.

In this case, the oxide semiconductor secondary cell is integrally formed as being layered on a region corresponding to the single chip. Pattern etching is performed on the integrally-formed oxide semiconductor secondary cell so that a region corresponding to the single chip is kept and other regions not corresponding to the single chip are eliminated. Thus, the oxide semiconductor secondary cell corresponding to the single chip is formed. Since the detailed manufacturing method is substantially the same as the method for forming the oxide semiconductor secondary cells for the respective chips on the wafer 20 on which the plurality of chips 22 are formed (see the flowchart of FIG. 8, and the like), description thereof will not be repeated.

DESCRIPTION OF REFERENCES

10 Oxide semiconductor secondary cell
12 First electrode

14 Charging function layer
16 Second electrode
18 P-type metal oxide semiconductor layer
20 Wafer
22 Chip
24 Chip substrate
26, 40 Electrode pad
28 Electronic circuit
32 Gate electrode
34 First wiring layer
36 Second wiring layer
38 Third wiring layer
39 Passivation film
42 Via-hole
44 Scribe region
46 Secondary cell mounting region
48 Secondary cell forming region
50, 50-1-8 Oxide semiconductor secondary cell
52 First electrode
54 N-type metal oxide semiconductor layer
56 Charging layer
58 P-type metal oxide semiconductor layer
60 Second electrode
70, 80 Passivation film
72, 72-1 First electrode connection opening
74 First electrode pad
76 First electrode connection line
78 Second electrode pad
82-1, 82-2, 82-3 Second electrode connection opening
84 Second electrode connection line
86 Serial connection line
90 Chip with oxide semiconductor secondary cell
92 External Power source
94-1, 94-2 Power impedance
96 Circuit element
98 Output driver
99 Discharge current
100-1, 100-2 Decoupling capacitor
102 Output signal line
104-1 Power noise
104-2 Ground noise
106 Traditional slew rate
108 Slew rate of circuit chip with secondary cell
110-1, 110-2 Monolithic solid-state thin film secondary cell group
112-1, 112-2 Internal wiring
113 Logic circuit unit
114 Memory circuit unit
116 IC/LSI memory circuit unit
120 Lead frame
122 Solid-state cell
124 Semiconductor chip
126 Epoxy resin
128 Gold wire

The invention claimed is:

1. A method for manufacturing chips on which an oxide semiconductor secondary cell is mounted respectively, the oxide semiconductor secondary cell being formed by layering a first electrode, a charging function layer, and a second electrode on a circuit, the method comprising:
a layering process to layer and form oxide semiconductor secondary cells integrally at regions corresponding to a plurality of chips formed on a wafer without separately forming the oxide semiconductor secondary cells at regions corresponding to the respective chips;
a separating process to perform separation into individual oxide semiconductor secondary cells corresponding to the respective chips by performing pattern etching on the integrally-formed oxide semiconductor secondary cells to eliminate regions not corresponding to the respective chips except for regions corresponding to the respective chips;
a first electrode forming process to form the first electrode on each chip via an insulating layer;
a first electrode connection line forming process to form a first electrode connection line for connecting the first electrode to a first electrode pad on each chip via a via-hole of the insulating layer, wherein the first electrode forming process and the first electrode connection line forming process are concurrently performed; and
a flattening process to thicken the insulating layer, after the first electrode forming process and the first electrode connection line forming process are concurrently performed, for covering the first electrode pad and flattening a step between the insulting layer and the first electrode.

2. The method for manufacturing chips on which an oxide semiconductor secondary cell is mounted respectively according to claim 1, comprising:
a second electrode connection line forming process to connect the second electrode to a second electrode pad formed at each chip, the second electrode pad being different from the first electrode pad.

3. The method for manufacturing chips on which an oxide semiconductor secondary cell is mounted respectively according to claim 1, comprising
another flattening process to flatten the insulating layer before the first electrode is formed on each chip via the insulating layer formed on each chip.

4. The method for manufacturing chips on which an oxide semiconductor secondary cell is mounted respectively according to claim 1, comprising:
a second electrode connection line forming process to connect the second electrode to a second electrode pad formed at each chip after the separating process, the second electrode pad being different from the first electrode pad.

5. The method for manufacturing chips on which an oxide semiconductor secondary cell is mounted respectively according to claim 1,
wherein the charging function layer is formed with an n-type metal oxide semiconductor forming process to form an n-type metal oxide semiconductor layer on the first electrode, a charging layer forming process to form a charging layer, obtained by filling an n-type metal oxide semiconductor into an insulating member, on the n-type metal oxide semiconductor layer, and a p-type metal oxide semiconductor layer forming process to form a p-type metal oxide semiconductor layer on the charging layer.

6. The method for manufacturing chips on which an oxide semiconductor secondary cell is mounted respectively according to claim 1,
wherein the integrally-formed oxide semiconductor secondary cells are separated into pieces and a plurality of the secondary cells are formed on each chip in the separating process.

7. The method for manufacturing chips on which an oxide semiconductor secondary cell is mounted respectively according to claim 6, comprising
a serial connection line forming process to serially connect the plurality of oxide semiconductor secondary cells formed on each chip.

8. The method for manufacturing chips on which an oxide semiconductor secondary cell is mounted respectively according to claim 1, comprising
 a serial connection line forming process to serially connect some of the plurality of oxide semiconductor secondary cells formed on each chip, without connecting to the chip, to an oxide semiconductor secondary cell that is connected to another chip.

9. The method for manufacturing chips on which an oxide semiconductor secondary cell is mounted respectively according to claim 8,
 wherein the serial connection line forming process is performed concurrently with a second electrode connection line forming process to connect the second electrode and a second electrode pad formed on the wafer.

10. A method for manufacturing chips on which an oxide semiconductor secondary cell is mounted respectively, the oxide semiconductor secondary cell being formed by layering a first electrode, a charging function layer, and a second electrode on a circuit, the method comprising:
 a layering process to layer and form oxide semiconductor secondary cells integrally at regions corresponding to a plurality of chips formed on a wafer without separately forming the oxide semiconductor secondary cells at regions corresponding to the respective chips;
 a separating process to perform separation into individual oxide semiconductor secondary cells corresponding to the respective chips by performing pattern etching on the integrally-formed oxide semiconductor secondary cells to eliminate regions not corresponding to the respective chips except for regions corresponding to the respective chips;
 a first electrode forming process to form the first electrode on each chip via an insulating layer;
 a first electrode connection line forming process to form a first electrode connection line for connecting the first electrode to a first electrode pad on each chip via a via-hole of the insulating layer, wherein the first electrode forming process and the first electrode connection line forming process are concurrently performed;
 an insulating layer forming process to form the insulating layer on each chip;
 a process to flatten the insulating layer; and
 an opening forming process to form an opening communicating with each chip at the insulating layer,
 wherein the first electrode forming process and the first electrode connection line forming process are concurrently performed by forming a first electrode pattern on the insulating layer and the opening.

11. A method for manufacturing chips on which an oxide semiconductor secondary cell is mounted respectively, the oxide semiconductor secondary cell being formed by layering a first electrode, a charging function layer, and a second electrode on a circuit, the method comprising:
 a layering process to layer and form oxide semiconductor secondary cells integrally at regions corresponding to a plurality of chips formed on a wafer without separately forming the oxide semiconductor secondary cells at regions corresponding to the respective chips; and
 a separating process to perform separation into individual oxide semiconductor secondary cells corresponding to the respective chips by performing pattern etching on the integrally-formed oxide semiconductor secondary cells to eliminate regions not corresponding to the respective chips except for regions corresponding to the respective chips,
 wherein connecting between the second electrode and the chip is performed with a passivation film forming process to form an insulating passivation film at a region that covers the individual oxide semiconductor secondary cells including the second electrode after the second electrode is formed, an eliminating process to eliminate the passivation film at a region corresponding to the second electrode and a region corresponding to each chip to which the second electrode is to be connected, and a second electrode connection line forming process to form a second electrode connection line pattern for connecting the second electrode and each chip at regions where the passivation is eliminated with the eliminating process.

12. A method for manufacturing chips on which an oxide semiconductor secondary cell is mounted respectively, the oxide semiconductor secondary cell being formed by layering a first electrode, a charging function layer, and a second electrode on a circuit, the method comprising:
 a layering process to layer and form oxide semiconductor secondary cells integrally at regions corresponding to a plurality of chips formed on a wafer without separately forming the oxide semiconductor secondary cells at regions corresponding to the respective chips; and
 a separating process to perform separation into individual oxide semiconductor secondary cells corresponding to the respective chips by performing pattern etching on the integrally-formed oxide semiconductor secondary cells to eliminate regions not corresponding to the respective chips except for regions corresponding to the respective chips, wherein:
 the charging function layer is formed with an n-type metal oxide semiconductor forming process to form an n-type metal oxide semiconductor layer on the first electrode, a charging layer forming process to form a charging layer, obtained by filling an n-type metal oxide semiconductor into an insulating member, on the n-type metal oxide semiconductor layer, and a p-type metal oxide semiconductor layer forming process to form a p-type metal oxide semiconductor layer on the charging layer, and
 the charging layer is formed by coating and burning chemical fluid including aliphatic acid titanium and silicon oil.

13. The method for manufacturing chips on which an oxide semiconductor secondary cell is mounted respectively according to claim 12,
 wherein the charging layer formed by burning is irradiated with ultraviolet.

* * * * *